(12) United States Patent
Yamamoto et al.

(10) Patent No.: US 7,026,705 B2
(45) Date of Patent: Apr. 11, 2006

(54) SEMICONDUCTOR DEVICE WITH SURGE PROTECTION CIRCUIT CAPABLE OF PREVENTING CURRENT LEAKAGE

(75) Inventors: Fumitoshi Yamamoto, Hyogo (JP); Akio Uenishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/787,223

(22) Filed: Feb. 27, 2004

(65) Prior Publication Data

US 2004/0169233 A1 Sep. 2, 2004

Related U.S. Application Data

(63) Continuation-in-part of application No. 10/657,106, filed on Sep. 9, 2003, now abandoned.

(30) Foreign Application Priority Data

Feb. 28, 2003 (JP) .............................. 2003-052780

(51) Int. Cl.
*H01L 27/102* (2006.01)
(52) U.S. Cl. ...................................... 257/577; 257/565
(58) Field of Classification Search ................ 257/565, 257/577, 578, 579, 580, 581, 582, 583, 584
See application file for complete search history.

(56) References Cited

U.S. PATENT DOCUMENTS 4,722,910 A * 2/1988 Yasaitis
5,341,005 A * 8/1994 Canclini
6,268,639 B1 * 7/2001 Li et al.

FOREIGN PATENT DOCUMENTS

| EP | 0 418 896 A2 | 3/1991 |
|---|---|---|
| JP | 56-19657 | 2/1981 |
| JP | 58-74081 | 5/1983 |
| JP | 5-206385 | 8/1993 |

OTHER PUBLICATIONS

Wolf, "Silicon Processing for the VLSI Era, vol. 2—Process Integration," 1990, Lattice Press, p. 12-13.*

* cited by examiner

Primary Examiner—Nathan J. Flynn
Assistant Examiner—Kevin Quinto
(74) Attorney, Agent, or Firm—McDermott Will & Emery LLP

(57) ABSTRACT

A semiconductor device has a surge protection circuit electrically connected to a signal input terminal and including a diode and a transistor. The diode has its cathode region constituted of an $n^+$ diffusion layer, an $n^-$ epitaxial layer, an n-type diffusion layer and an $n^+$ diffusion layer. The $n^+$ diffusion layer is electrically connected to a conductive layer and formed at a main surface of a semiconductor substrate. The $n^+$ diffusion layer constitutes, together with a p-type diffusion layer, a pn junction where Zener breakdown occurs, and the pn junction with the Zener breakdown occurring therein is distant from a field oxide film. Then, the semiconductor device with the surge protection circuit without suffering from current leakage and thus normally operating can be achieved.

9 Claims, 25 Drawing Sheets

SEMICONDUCTOR DEVICE WITH SURGE PROTECTION CIRCUIT CAPABLE OF PREVENTING CURRENT LEAKAGE

This application a continuation-in-part of application Ser. No. 10/657,106, filed Sep. 9, 2003, now abandoned.

BACKGROUND OF THE INVENTION

1. Field of the Invention

The present invention relates to semiconductor devices and more particularly to a semiconductor device having a surge protection circuit.

2. Description of the Background Art

There have been proposed various surge protection circuits for protecting, a motor vehicle, a motor, a fluorescent display and an audio device, for example, as well as an IC (Integrated Circuit) constituted of transistor devices for example, from an instantaneously increased current or voltage (surge). One of the proposed circuits, a surge protection circuit constituted of one diode and one npn transistor is known as a device which can be implemented with a simple configuration. A conventional surge protection circuit constituted of one diode and one npn transistor is configured as detailed below.

In the conventional surge protection circuit constituted of one diode and one npn transistor, the cathode of the diode has a first $n^+$ diffusion layer of high concentration formed at a main surface of a semiconductor substrate that is electrically isolated by a field oxide film. The first $n^+$ diffusion layer contacts a conductive layer formed on the semiconductor substrate and is thus connected electrically to a signal input terminal. The anode of the diode has a p-type diffusion layer and a $p^+$ diffusion layer formed in the p-type diffusion layer. The $p^+$ diffusion layer directly contacts the $n^+$ diffusion layer serving as the cathode.

Moreover, the collector of the npn transistor has the first $n^+$ diffusion layer, a buried $n^+$ diffusion layer and an $n^-$ epitaxial layer formed in the semiconductor substrate. The base of the npn transistor has the p-type diffusion layer formed in the $n^-$ epitaxial layer. The emitter of the npn transistor has a second $n^+$ diffusion layer formed in the p-type diffusion layer.

The first $n^+$ diffusion layer is included in the cathode region of the diode and included in the collector region of the npn transistor. Further, the p-type diffusion layer is included in the anode region of the diode and in the base region of the npn transistor.

An operation of the above conventional surge protection circuit is now described. When a surge voltage is applied to the signal input terminal, the surge voltage is then applied to the first $n^+$ diffusion layer to increase a reverse voltage of the diode. This reverse voltage exceeding a certain level causes Zener breakdown of the diode and accordingly a current flows from the cathode to the anode of the diode. The p-type diffusion layer included in the anode region is also included in the base region of the npn transistor. Then, the current flows as a base current of the npn transistor. Accordingly, the npn transistor is turned on to discharge the charge of the surge applied to the signal input terminal from the emitter of the npn transistor.

Any surge protection circuits except for the above one are disclosed, for example, in Japanese Patent Laying-Open Nos. 5-206385 and 56-19657.

In the conventional surge protection circuit having the above-described configuration, the first $n^+$ diffusion layer is formed to have a high concentration in order to reduce contact resistance between the first $n^+$ diffusion layer serving as the cathode of the diode and the conductive layer mentioned above. Further, if a part of the anode region that contacts the first $n^+$ diffusion layer has a low concentration, electrons that are present in a depletion layer of the pn junction between the first $n^+$ diffusion layer and the anode (p-type diffusion layer) are trapped in the field oxide film adjacent to the first $n^+$ diffusion layer when breakdown of the diode occurs. Then, a problem arises that the depletion layer of the pn junction expands to increase the breakdown voltage of the diode. Therefore, it is required to form the $p^+$ diffusion layer of high concentration in a part, which contacts the first $n^+$ diffusion layer, of the p-type diffusion layer serving as the anode, in order to flow electrons from the first $n^+$ diffusion layer smoothly to the anode (p-type diffusion layer). In other words, both of the anode region and the cathode region constituting the pn junction where the Zener breakdown occurs should be formed with high concentration.

If, however, the anode region and the cathode region forming the pn junction where Zener breakdown occurs are both formed with high concentration, the width of the depletion layer of the pn junction between the anode region and the cathode region is extremely small. A phenomenon (leakage of current) then occurs that is current flow in the surge protection circuit with any voltage lower than the breakdown voltage, resulting in a problem that the surge protection circuit does not operate normally.

SUMMARY OF THE INVENTION

An object of the present invention is to provide a semiconductor device having a surge protection circuit without suffering from occurrence of current leakage and thus operating normally.

A semiconductor device according to the present invention includes a surge protection circuit electrically connected to a signal input terminal and having a diode and a transistor. The semiconductor device includes a semiconductor substrate having a main surface, a field oxide film formed at the main surface of the semiconductor substrate, and a first conductive layer formed on the main surface of the semiconductor substrate and electrically connected to the signal input terminal. The diode has its cathode including a first cathode region and a second cathode region, the first cathode region is electrically connected to the first conductive layer and formed at the main surface of the semiconductor substrate, and the second cathode region constitutes, together with an anode region of the diode, a pn junction where Zener breakdown occurs. The pn junction where the Zener breakdown occurs is distant from the field oxide film.

In the semiconductor device of the present invention, the first cathode region electrically connected to the first conductive layer and the second cathode region constituting the pn junction where Zener breakdown occurs are separately formed. Therefore, the impurity concentration of the first cathode region can be increased to reduce contact resistance with the first conductive layer. Moreover, the impurity concentrations of the anode region and the second cathode region can be reduced to prevent current leakage. Further, as the pn junction between the anode region and the second cathode region where Zener breakdown occurs is distant from the field oxide film, a problem that the breakdown voltage of the diode increases can be solved. Here, the increase of the breakdown voltage is caused when electrons that are present in the depletion layer of the pn junction between the anode region and the cathode region are trapped in the field oxide film to expand the depletion layer of the pn junction. Accordingly, the semiconductor device having the surge protection circuit without suffering from current leakage and thus operating normally can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described in connection with the drawings.

First Embodiment

Figure 1:
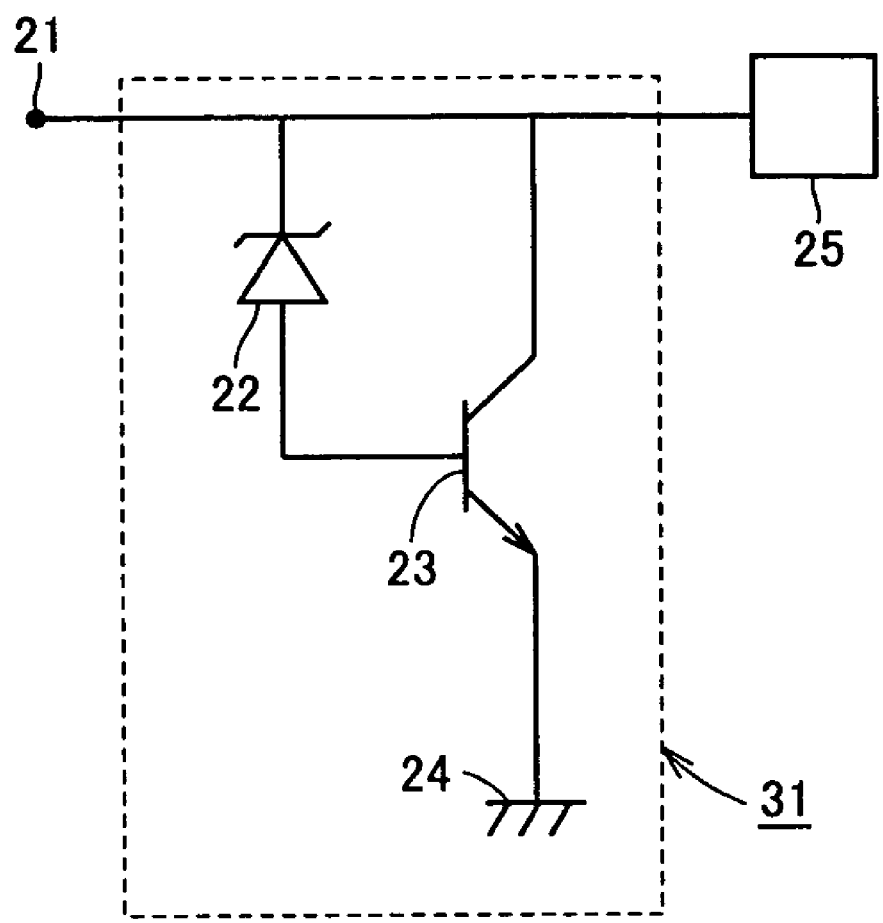
FIG. 1 is a circuit diagram showing a surge protection circuit in a first embodiment of the present invention.

Referring to FIG. 1, a surge protection circuit 31 includes a diode 22 and an npn transistor 23. The cathode of diode 22 and the collector of npn transistor 23 are electrically connected to a signal input terminal 21 and to a device portion 25. The anode of diode 22 and the base of npn transistor 23 are electrically connected to each other. The emitter of npn transistor 23 is electrically connected to a ground potential 24.

A configuration of a semiconductor device having the surge protection circuit in this embodiment is now described.

Figure 2:
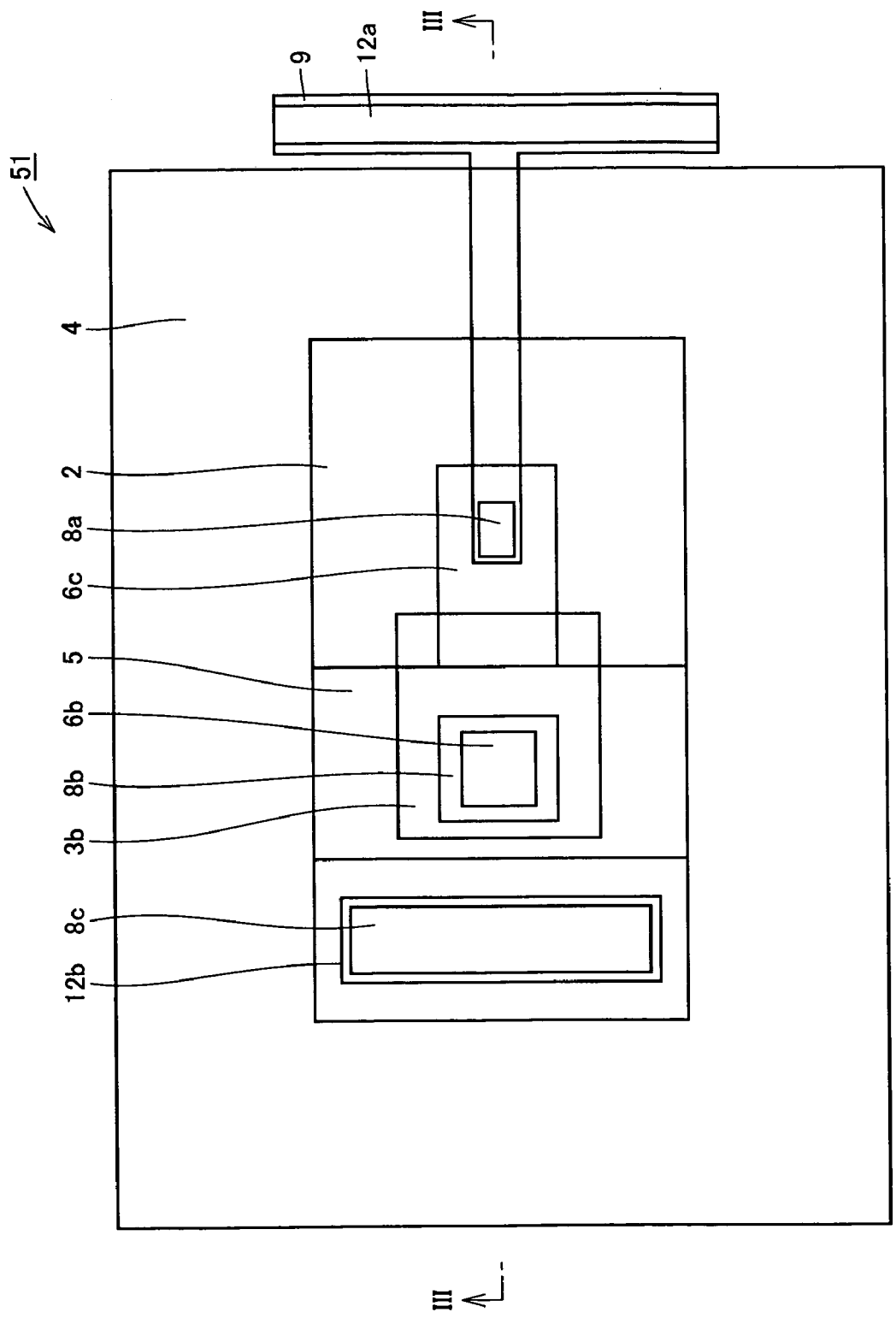
FIG. 2 is a plan view schematically showing a configuration of a semiconductor device having the surge protection circuit in the first embodiment of the present invention.
Figure 3:
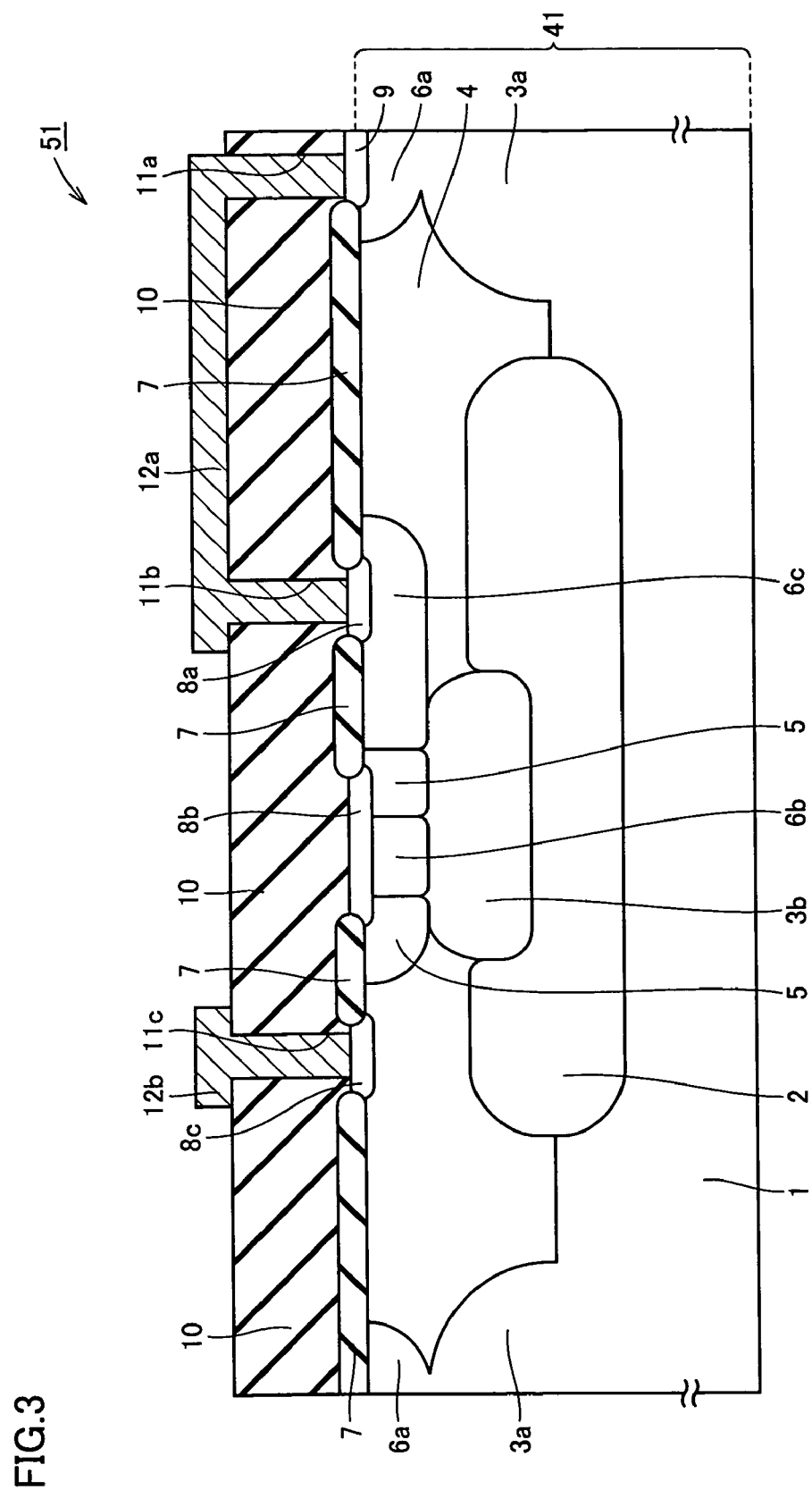
FIG. 3 is a cross-sectional view along line III—III in FIG. 2.

Referring to FIGS. 2 and 3, a semiconductor device 51 has a p⁻ region 1 formed in a lower part of a semiconductor substrate 41 formed, for example, of silicon single crystal. On p⁻ region 1, an n⁺ diffusion layer 2 is formed by implantation and diffusion. On this n⁺ diffusion layer 2, an n⁻ epitaxial layer 4 is formed. On p⁻ region 1, a p⁺ diffusion layer 3a and a p-type diffusion layer 6a are formed to enclose n⁻ epitaxial layer 4 and, a p⁺ diffusion layer 9 is formed in p-type diffusion layer 6a. In n⁺ diffusion layer 2 and n⁻ epitaxial layer 4, a p⁺ diffusion layer 3b is formed by implantation and diffusion. Moreover, a field oxide film 7 is formed at the surface of semiconductor substrate 41 for electrically isolating regions of the semiconductor substrate from each other. Field oxide film 7 refers to a silicon oxide film formed by LOCOS (Local Oxidation of Silicon). P⁺ diffusion layer 9, an n⁺ diffusion layer 8a, an n⁺ diffusion layer 8b and an diffusion layer 8c are thus electrically isolated from each other by field oxide film 7.

In this n⁺ diffusion layer 2 and n⁻ epitaxial layer 4, diode 22 and npn transistor 23 constituting the surge protection circuit are formed. Diode 22 has an anode region and a cathode region while npn transistor 23 has an emitter region, a base region and a collector region.

In diode 22, the anode region is constituted of a p-type diffusion layer 6b formed in an n-type diffusion layer 5. N-type diffusion layer 5 is formed in n⁻ epitaxial layer 4. The cathode region is constituted of n⁺ diffusion layer 8c (first cathode region) formed in n⁻ epitaxial layer 4, n⁻ epitaxial layer 4, n-type diffusion layer 5, and n⁺ diffusion layer 8b (second cathode region) formed in n-type diffusion layer 5 and p-type diffusion layer 6b.

In npn transistor 23, the collector region is constituted of n⁺ diffusion layer 8c formed in n⁻ epitaxial layer 4, n⁻ epitaxial layer 4 and n⁺ diffusion layer 2. The base region is constituted of p-type diffusion layer 6c formed in n⁻ epitaxial layer 4. The emitter region is constituted of n⁺ diffusion layer 8a formed in p-type diffusion layer 6c.

In this embodiment, a pn junction where Zener breakdown occurs is formed of p-type diffusion layer 6b and n⁺ diffusion layer 8b. N⁺ diffusion layer 8b is formed to cover the upper surface of p-type diffusion layer 6b. With semiconductor substrate 41 viewed from the above (FIG. 2), n⁺ diffusion layer 8b is seen to have its periphery electrically connected to n-type diffusion layer 5. Further, n-type diffusion layer 5 is formed to cover the side of p-type diffusion layer 6b. The cathode region constituted of n⁺ diffusion layer 8b and n-type diffusion layer 5 is thus formed in the shape of a quadrangular prism and, in this quadrangular prism, p-type diffusion layer 6b serving as the anode region is formed. Accordingly, the pn junction (pn junction formed of p-type diffusion layer 6b and n⁺ diffusion layer 8b) where Zener breakdown occurs is formed within the quadrangular prism, and is thus distant from field oxide film 7.

N-type diffusion layer 5 is formed by implantation of P (phosphorus) into n⁻ epitaxial layer 4 with an implantation dose, for example, of approximately $10^{12}$ ions/cm². P-type diffusion layers 6a–6c are formed by implantation of B (boron) into n⁻ epitaxial layer 4 with an implantation dose, for example of approximately $10^{13}$ ions/cm². N⁺ diffusion layers 8a–8c are formed by implantation of As (arsenic) to the surfaces of n⁻ epitaxial layer 4, n-type diffusion layer 5 and p-type diffusion layer 6b, and p-type diffusion layer 6c with an implantation dose, for example, of approximately $10^{15}$ ions/cm². P⁺ diffusion layer 9 is formed by implantation of B or BF₂ to the surface of p-type diffusion layer 6a with an implantation dose, for example, of approximately $10^{15}$ ions/cm².

An interlayer insulating film 10 is formed on the main surface of semiconductor substrate 41 to cover the surface of semiconductor substrate 41. In interlayer insulating film 10, contact holes 11a–11c are formed. Interconnections 12a and 12b formed of polycrystalline silicon into which impurities are introduced (herein referred to as doped polysilicon) are formed on interlayer insulating film 10 to be connected electrically to respective regions discussed above via contact holes 11a–11c. Accordingly, p⁺ diffusion layer 9 and n⁺ diffusion layer 8a are electrically connected. Interconnection 12b (first conductive layer) is electrically connected to signal input terminal 21 (FIG. 1) and device portion 25 (FIG. 1).

An operation of the surge protection circuit according to this embodiment is now described.

Referring to FIGS. 1–3, when a surge voltage is applied to signal input terminal 21, the surge voltage is applied to n⁺ diffusion layer 8b and a reverse voltage between the anode and cathode of diode 22 increases. Then, Zener breakdown of diode 22 occurs and a current flows from n⁺ diffusion layer 8b to p-type diffusion layer 6b. From this p-type diffusion layer 6b, the current flows to p-type diffusion layer 6a which is the base region of npn transistor 23 to turn on npn transistor 23. Upon the turning-on of npn transistor 23, the current flows from n⁻ epitaxial layer 4 to n⁺ diffusion layer 8a to release the surge voltage applied to signal input terminal 21 to interconnection 12a. In this way, application of the surge voltage to device portion 25 is prevented.

According to this embodiment, the cathode region of diode 22 is constituted of n⁺ diffusion layer 8c, n⁻ epitaxial layer 4, n-type diffusion layer 5 and n⁺ diffusion layer 8b. Of these layers, n⁺ diffusion layer 8c electrically connected to interconnection 12b and n⁺ diffusion layer 8b constituting the pn junction where Zener breakdown occurs are formed of different regions. Then, contact resistance relative to interconnection 12b can be reduced by increasing the impurity concentration of n⁺ diffusion layer 8c. Leakage of current can be prevented by decreasing respective impurity concentrations of p-type diffusion layer 6b and n⁺ diffusion layer 8b. Further, as the pn junction between p-type diffusion layer 6b and n⁺ diffusion layer 8b where Zener breakdown occurs is distant from field oxide film 7, a problem that the breakdown voltage of diode 22 increases can be solved. Here, the increase of the breakdown voltage is caused when electrons that are present in the depletion layer of the pn junction between the anode region and the cathode region are trapped in field oxide film 7 to expand the depletion layer of the pn junction. Accordingly, semiconductor device 51 having the surge protection circuit without suffering from current leakage and thus operating normally can be obtained.

The inventors of the present invention conducted the following experiment in order to confirm the above-discussed effect.

Figure 4A:
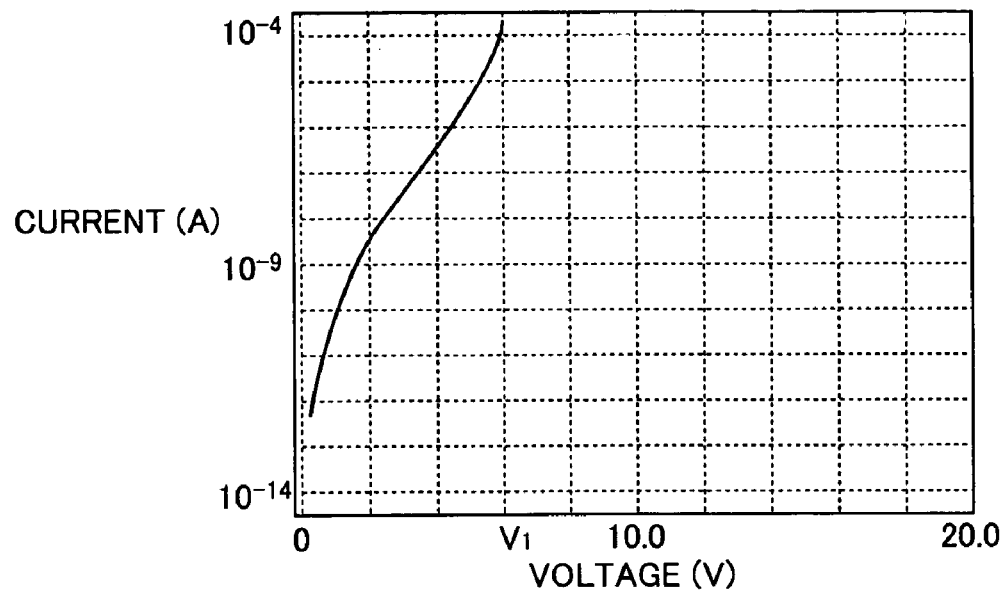
FIG. 4A shows current-voltage characteristics of a semiconductor device having a conventional surge protection circuit.
Figure 4B:
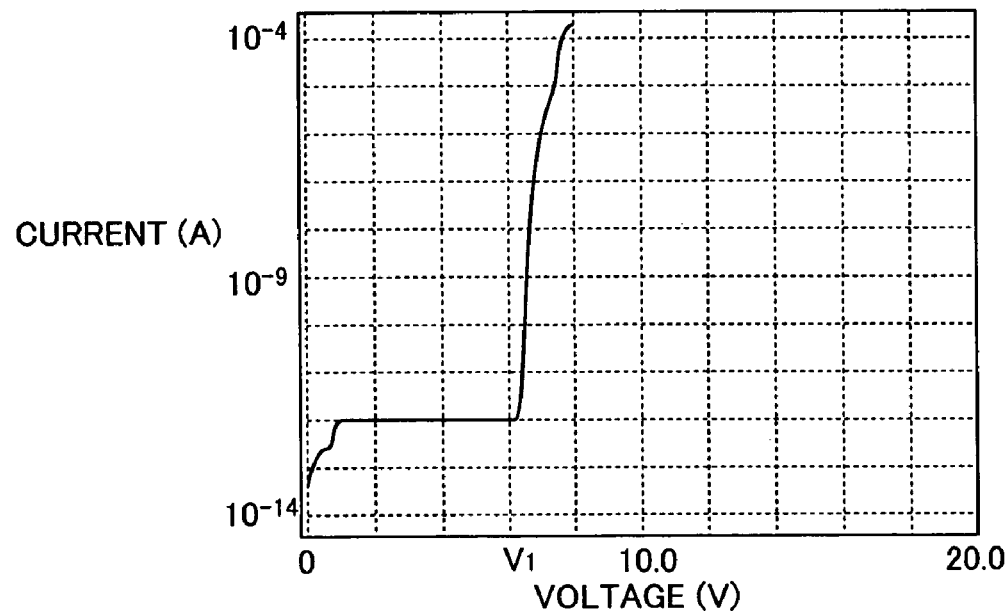
FIG. 4B shows current-voltage characteristics of the semiconductor device having the surge protection circuit in the first embodiment of the present invention.

Specifically, current-voltage characteristics of a conventional semiconductor device having a surge protection circuit as well as current-voltage characteristics of the semiconductor device having the surge protection circuit according to this embodiment were examined. Referring to FIGS. 4A and 4B, as for the current, a current flowing through npn transistor 23 (FIG. 1) is logarithmically plotted. The voltage is shown as a potential on signal input terminal 21 (FIG. 1) on the assumption that ground potential 24 (FIG. 1) is 0. $V_1$ indicates a breakdown voltage of diode 22 (FIG. 1).

It is seen from the experimental results that, a current flows in the conventional surge protection circuit even when the voltage is $V_1$ or less. This is due to current leakage of diode 22. On the other hand, according to the present invention, only a slight current on the order of $10^{-12}$ A flows when the voltage is $V_1$ or less. Then, when the voltage exceeds $V_1$, a large current suddenly flows. It is accordingly seen that no current leakage occurs in the semiconductor device having the surge protection circuit of the first embodiment of the present invention and thus a normal operation is performed.

Further, according to this embodiment, in surge protection circuit 31, the cathode of diode 22 and the collector of transistor 23 are electrically connected to signal input terminal 21 and the anode of diode 22 and the base of transistor 23 are of the same conductivity type and connected electrically to each other.

The circuit is thus configured to ensure that diode 22 breaks down before transistor 23 does. Then, diode 22 breaks down to allow transistor 23 to be surely turned on, thereby allowing a surge voltage applied to signal input terminal 21 to be surely released. Therefore, surge protection circuit 31 capable of preventing a malfunction thereby operating normally can be implemented.

Moreover, according to this embodiment, $n^+$ diffusion layer 8b which is the cathode region constituting the pn junction where Zener breakdown occurs is formed to cover the upper surface of p-type diffusion layer 6b which is the anode region.

Then, such a configuration in which the pn junction where Zener breakdown occurs is distant from field oxide film 7 can readily be produced. Accordingly, an increase of the breakdown voltage of diode 22 can be prevented easily, the increase being caused when electrons in the depletion layer of the pn junction where Zener breakdown occurs are trapped in field oxide film 7 to cause an increased width of the depletion layer.

According to this embodiment, $n^+$ diffusion layer 8b which is the cathode region constituting the pn junction where Zener breakdown occurs is formed to cover the upper surface of p-type diffusion layer 6b which is the anode region. It is noted, however, that the present invention is not limited to such a configuration but applicable to a configuration in which the cathode region constituting the pn junction where Zener breakdown occurs is formed to cover the side of p-type diffusion layer 6b which is the anode region.

Second Embodiment

Figure 5:
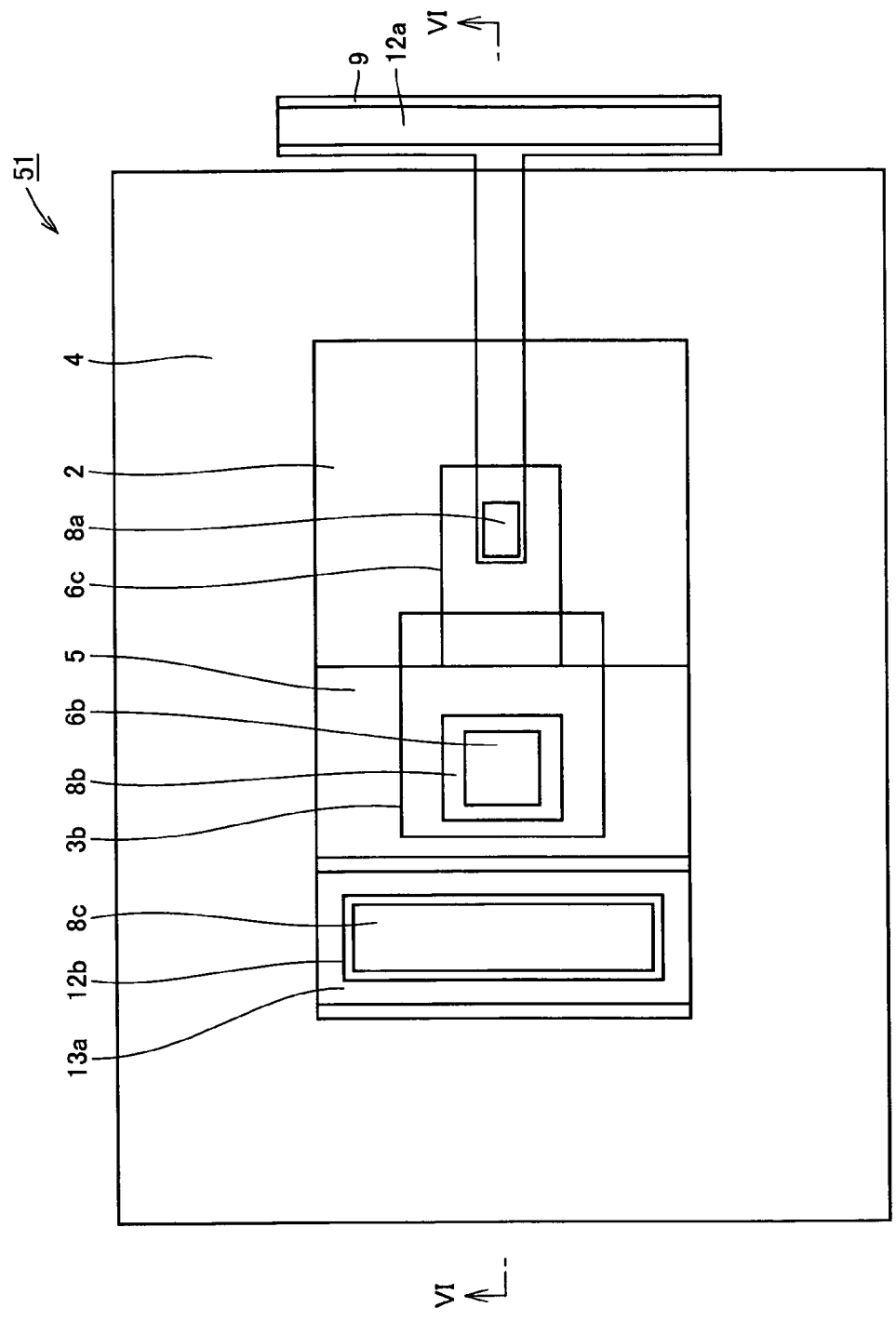
FIG. 5 is a plan view schematically showing a configuration of a semiconductor device having a surge protection circuit in a second embodiment of the present invention.
Figure 6:
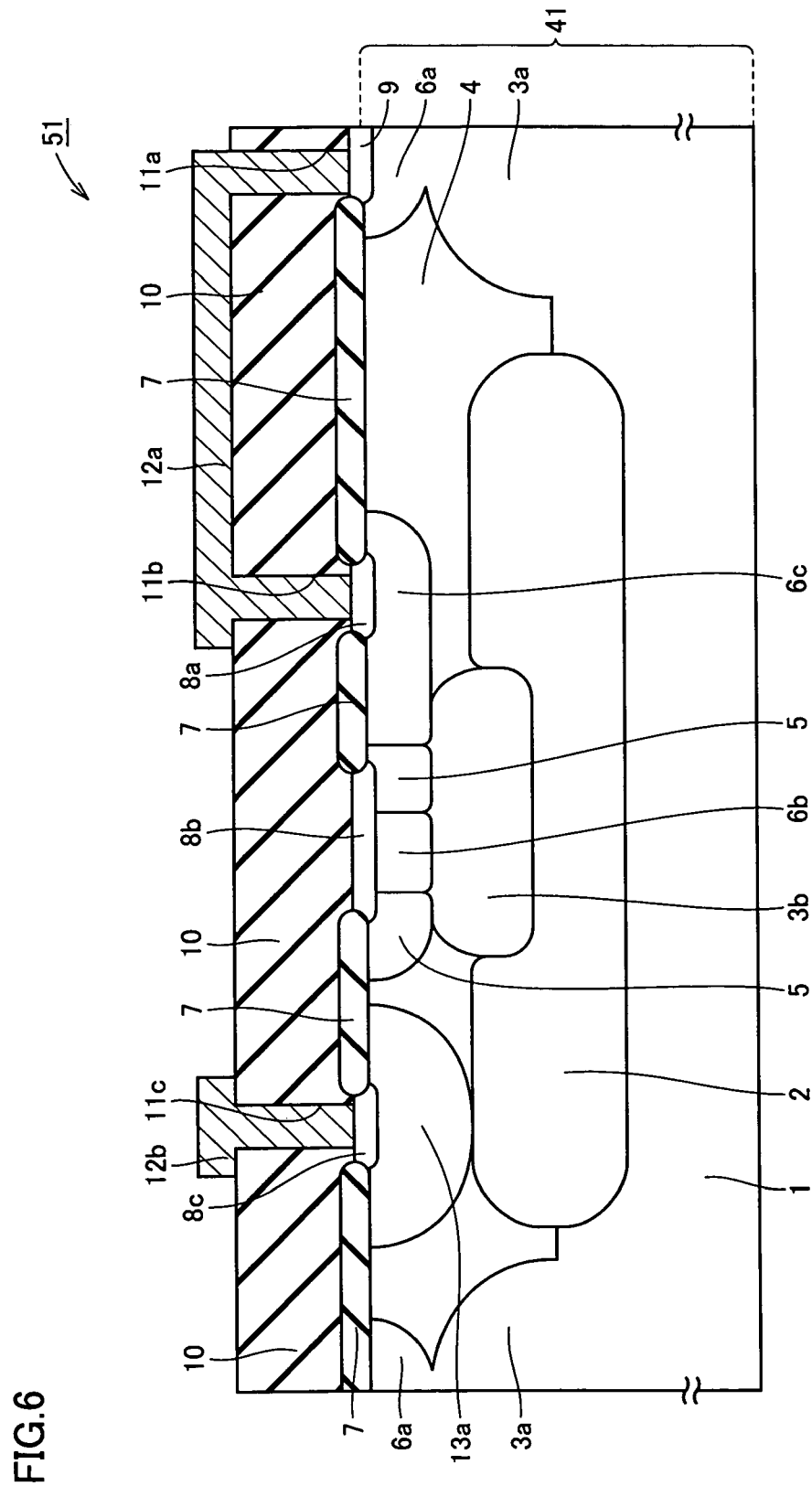
FIG. 6 is a cross-sectional view along line VI—VI in FIG. 5.

Referring to FIGS. 5 and 6, according to this embodiment, an $n^+$ diffusion layer 13a is formed in $n^-$ epitaxial layer 4 to enclose $n^+$ diffusion layer 8c. $N^+$ diffusion layer 13a is formed by implantation and diffusion of, for example, phosphorus glass into $n^-$ epitaxial layer 4 so as to reach $n^+$ diffusion layer 2. Then, the collector region of npn transistor 23 is constituted of $n^+$ diffusion layer 8c, $n^+$ diffusion layer 13a, $n^+$ diffusion layer 2 and $n^-$ epitaxial layer 4. $N^+$ diffusion layer 13a has its impurity concentration higher than that of $n^-$ epitaxial layer 4.

It is noted that the configuration here is almost similar to that of the first embodiment shown in FIGS. 1–3 except for the above-discussed details. The same components are thus denoted by the same reference character and description thereof is not repeated here.

In the semiconductor device having the surge protection circuit of this embodiment, the collector region of npn transistor 23 is constituted additionally of $n^+$ diffusion layer 13a. As the $n^+$ diffusion layer has a higher impurity concentration than that of the $n^-$ epitaxial layer, the electrical resistance of the collector region (collector resistance) is low. The transistor can accordingly have an improved operating speed and the surge protection circuit can operate even when a surge of high frequency occurs as detailed below.

The operating speed of the transistor is higher as the transit time $\tau_B$ of minority carriers in the base region is shorter. Transit time $\tau_B$ of minority carriers in the base region is represented by the following formula:

$$\tau_B = \frac{Q_B}{I_C} \quad (1)$$

where $Q_B$ indicates charge of minority carriers implanted into the base region, $I_C$ indicates collector current and $\tau_B$ indicates transit time of minority carriers in the base region. Referring to formula 1, transit time $\tau_B$ of minority carriers shortens with increase of collector current $I_C$. According to this embodiment, the $n^+$ diffusion layer is formed to decrease the collector resistance and accordingly increase collector current $I_C$. Consequently, transit time $\tau_B$ of minority carriers in the base region can be made shorter to improve the operating speed of the transistor, and the surge protection circuit can operate even when a surge of high frequency occurs.

Third Embodiment

Figure 7:
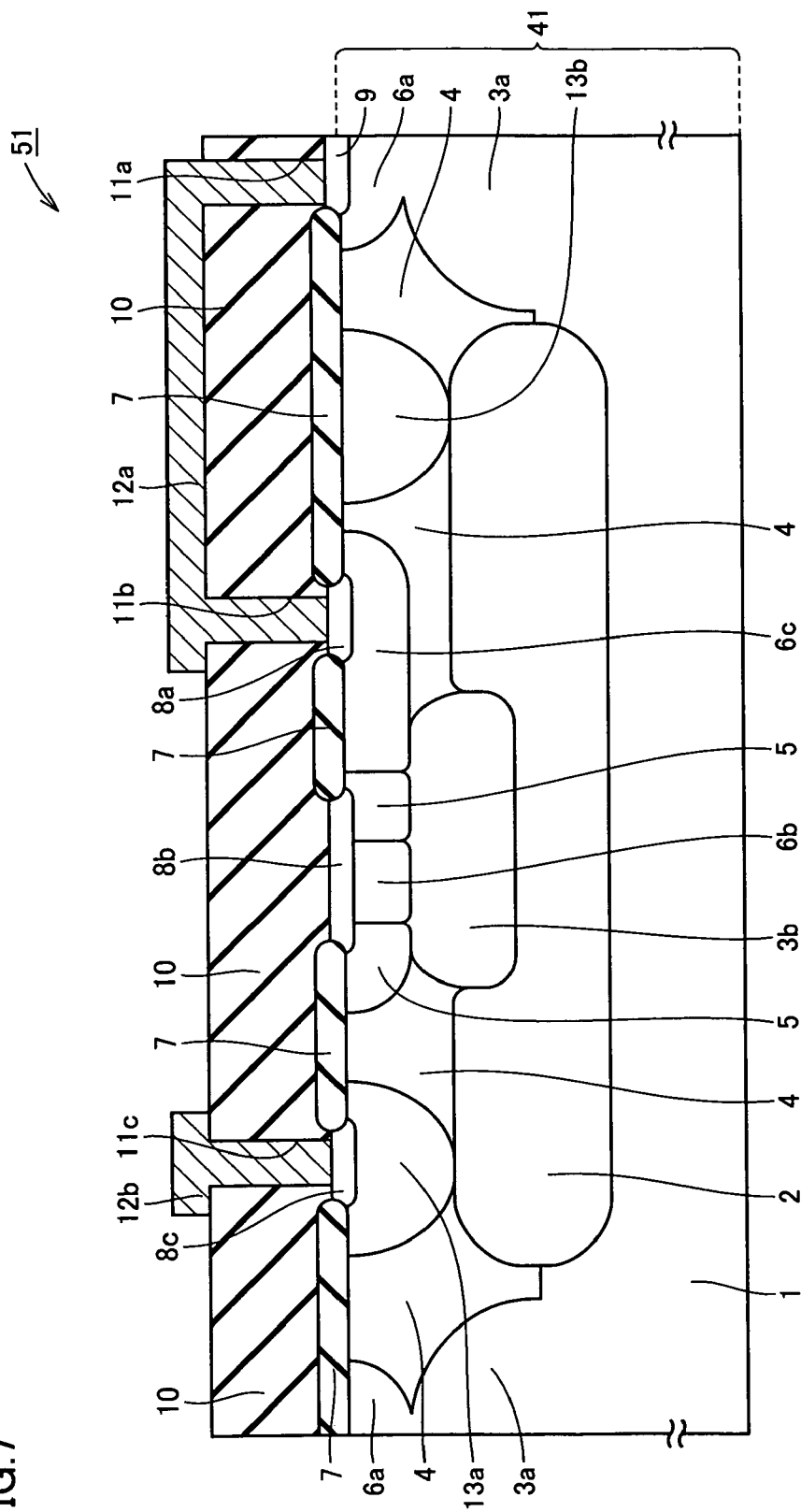
FIG. 7 is a cross-sectional view schematically showing a configuration of a semiconductor device having a surge protection circuit in a third embodiment of the present invention.

Referring to FIG. 7, according to this embodiment, an $n^+$ diffusion layer 13b is further formed in $n^-$ epitaxial layer 4 on the right side (in FIG. 7) of p-type diffusion layer 6a. $N^+$ diffusion layer 13b is formed by a similar method to that for $n^+$ diffusion layer 13a. Then, the collector region of npn transistor 23 is constituted of $n^+$ diffusion layer 8c, $n^+$ diffusion layer 13a, $n^+$ diffusion layer 2, $n^+$ diffusion layer 13b and $n^-$ epitaxial layer 4.

It is noted that the configuration here is almost similar to that of the second embodiment shown in FIG. 6 except for the above-discussed details. The same components are thus denoted by the same reference character and description thereof is not repeated here.

In the semiconductor device having the surge protection circuit of this embodiment, the collector region of npn transistor 23 is additionally constituted of $n^+$ diffusion layer 13b. As the $n^+$ diffusion layer has a higher impurity concentration than that of the $n^-$ epitaxial layer, the collector resistance is low. In this way, the operating speed of the transistor can further be improved and the surge protection circuit can operate even when a surge of high frequency occurs.

Fourth Embodiment

Figure 8:
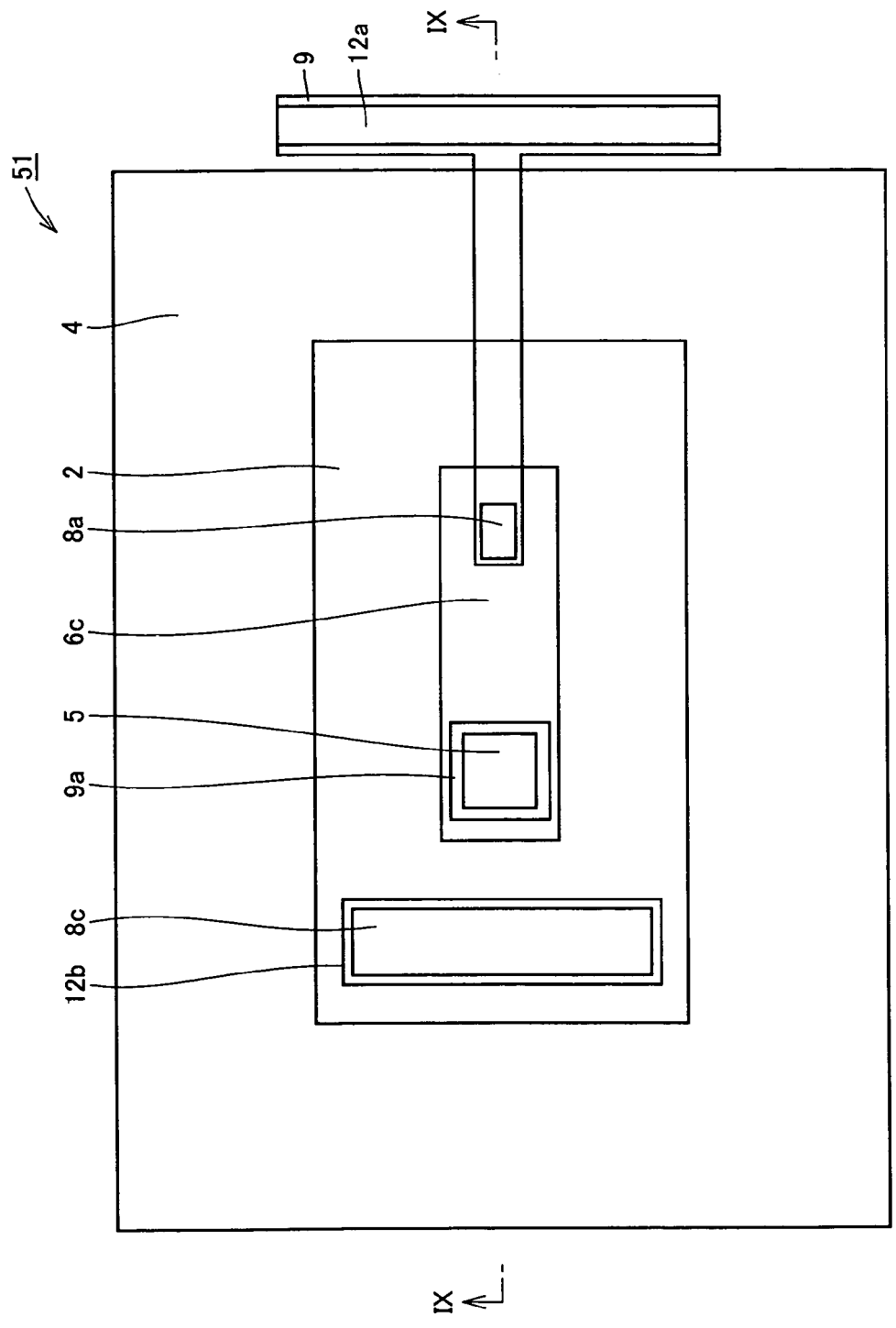
FIG. 8 is a plan view schematically showing a configuration of a semiconductor device having a surge protection circuit in a fourth embodiment of the present invention.
Figure 9:
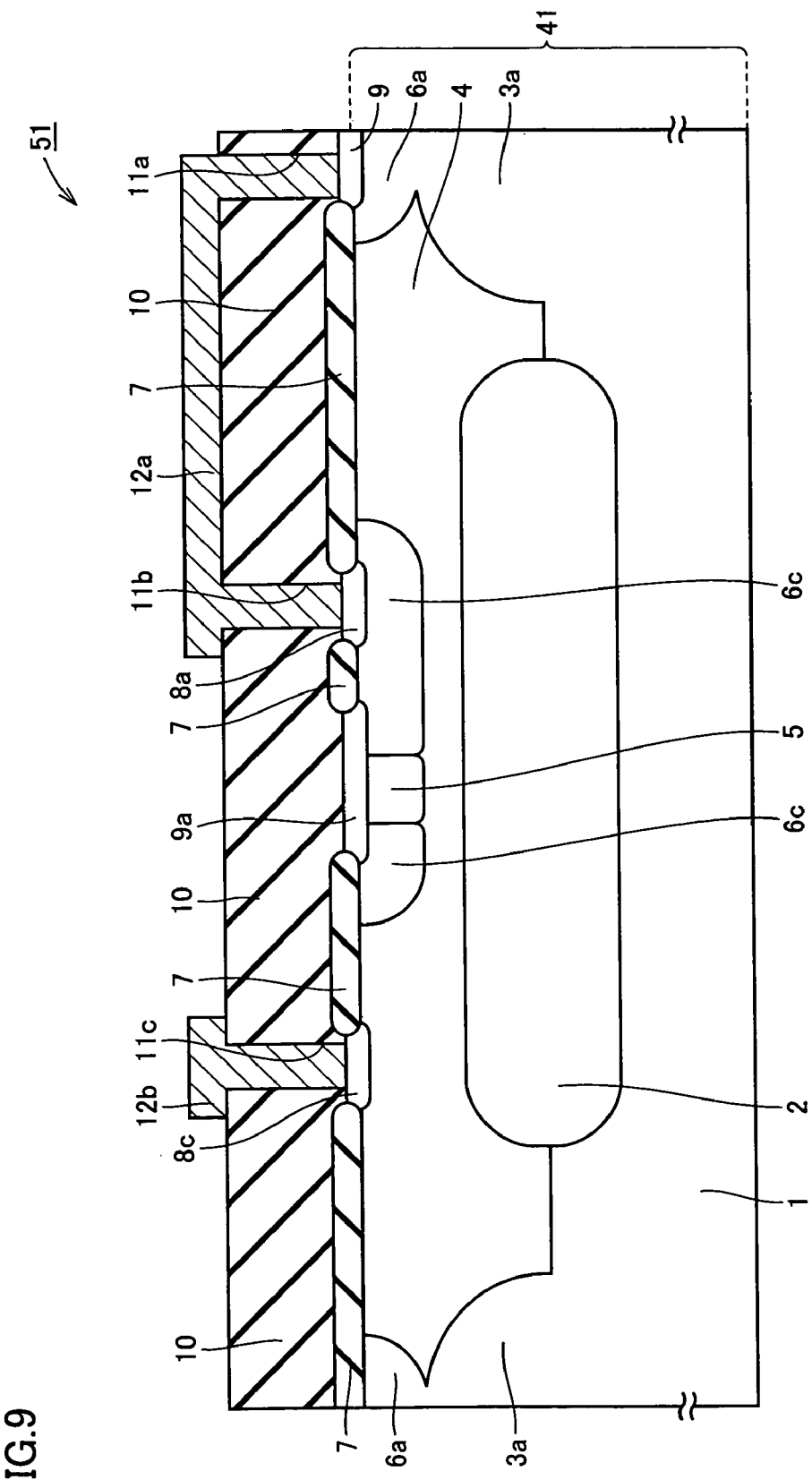
FIG. 9 is a cross-sectional view along line IX—IX in FIG. 8.

Referring to FIGS. 8 and 9, diode 22 is configured as discussed below according to this embodiment.

Specifically, in diode 22, the cathode region is constituted of $n^+$ diffusion layer 8c (first cathode region) formed in $n^-$ epitaxial layer 4, $n^-$ epitaxial layer 4 and n-type diffusion layer 5 (second cathode region) formed in $n^-$ epitaxial layer 4. The anode region is constituted of p-type diffusion layer 6c formed in $n^-$ epitaxial layer 4 and $p^+$ diffusion layer 9a formed in n-type diffusion layer 5 and p-type diffusion layer 6c. It is noted that $p^+$ diffusion layer 3b, p-type diffusion layer 6b and $n^+$ diffusion layer 8b are not formed.

According to this embodiment, a pn junction where Zener breakdown occurs is constituted of $p^+$ diffusion layer 9a and n-type diffusion layer 5. Here, $p^+$ diffusion layer 9a is formed to cover the upper surface of n-type diffusion layer 5. With semiconductor substrate 41 viewed from the above (FIG. 8), $p^+$ diffusion layer 9a is seen to have its periphery electrically connected to p-type diffusion layer 6c. Further, p-type diffusion layer 6c is formed to enclose the side of n-type diffusion layer 5. The anode region constituted of $p^+$ diffusion layer 9a and p-type diffusion layer 6c is thus formed in the shape of a quadrangular prism and, in this quadrangular prism, n-type diffusion layer 5 serving as the cathode region is formed. Accordingly, the pn junction (pn junction formed of $p^+$ diffusion layer 9a and n-type diffusion layer 5) where Zener breakdown occurs is formed within the quadrangular prism, and is thus distant from field oxide film 7.

It is noted that the configuration here is almost similar to that of the first embodiment shown in FIGS. 1–3 except for the above-discussed details. The same components are thus denoted by the same reference character and description thereof is not repeated here.

In the semiconductor device having the surge protection circuit of this embodiment, p⁺ diffusion layer 9a which is the anode region constituting the pn junction where Zener breakdown occurs is formed to cover the upper surface of n-type diffusion layer 5 which is the cathode region.

Then, such a configuration in which the pn junction where Zener breakdown occurs is distant from field oxide film 7 can easily be produced. Accordingly, an increase of the breakdown voltage of diode 22 can be prevented easily, the increase being caused when electrons in the depletion layer of the pn junction where Zener breakdown occurs are trapped in field oxide film 7 to cause an increased width of the depletion layer.

According to this embodiment, p⁺ diffusion layer 9a which is the anode region constituting the pn junction where Zener breakdown occurs is formed to cover the upper surface of n-type diffusion layer 5 which is the cathode region. It is noted, however, that the present invention is not limited to such a configuration but applicable to a configuration in which the anode region constituting the pn junction where Zener breakdown occurs is formed to cover the side of n-type diffusion layer 5 which is the cathode region.

Fifth Embodiment

Figure 10:
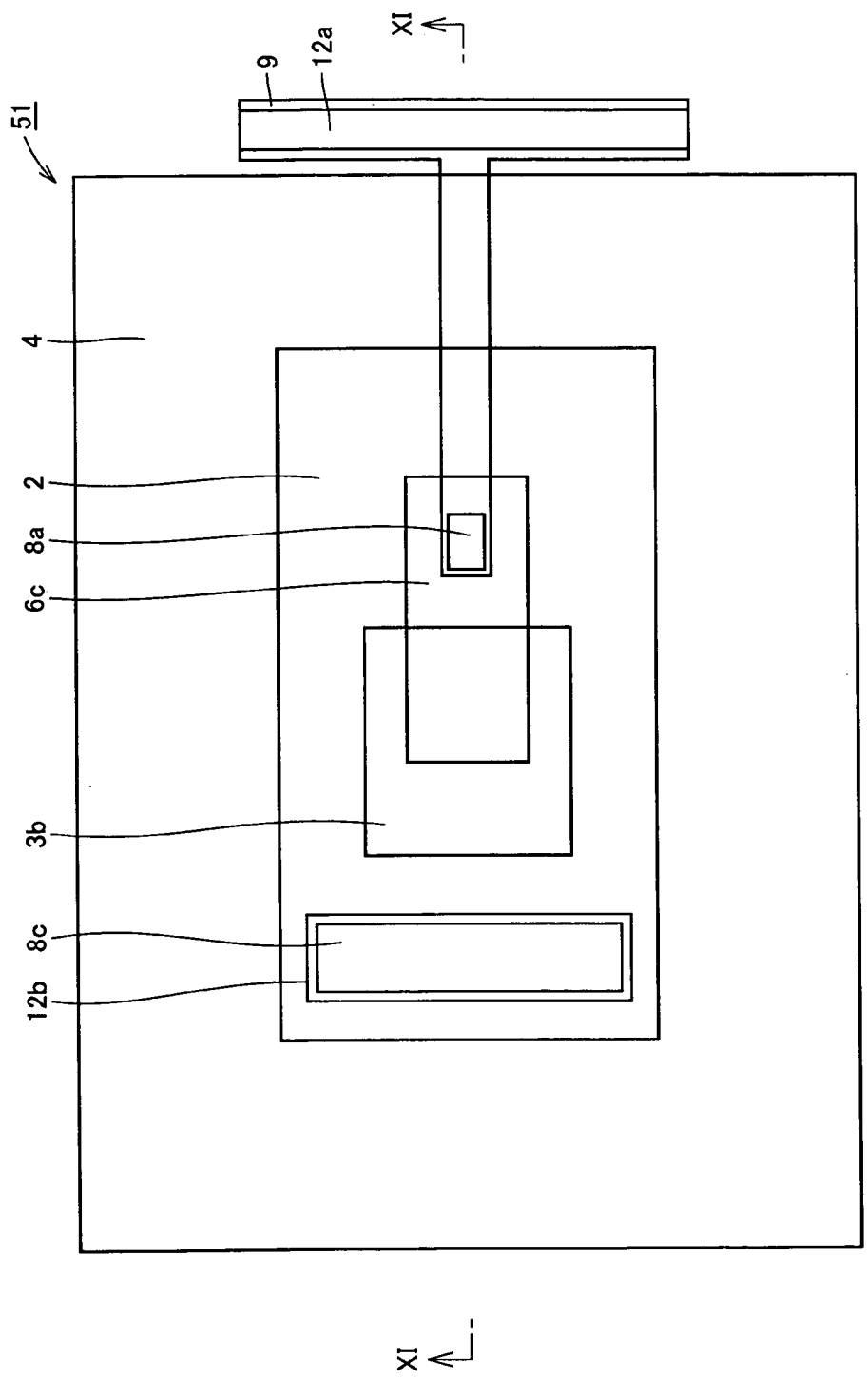
FIG. 10 is a plan view schematically showing a configuration of a semiconductor device having a surge protection circuit in a fifth embodiment of the present invention.
Figure 11:
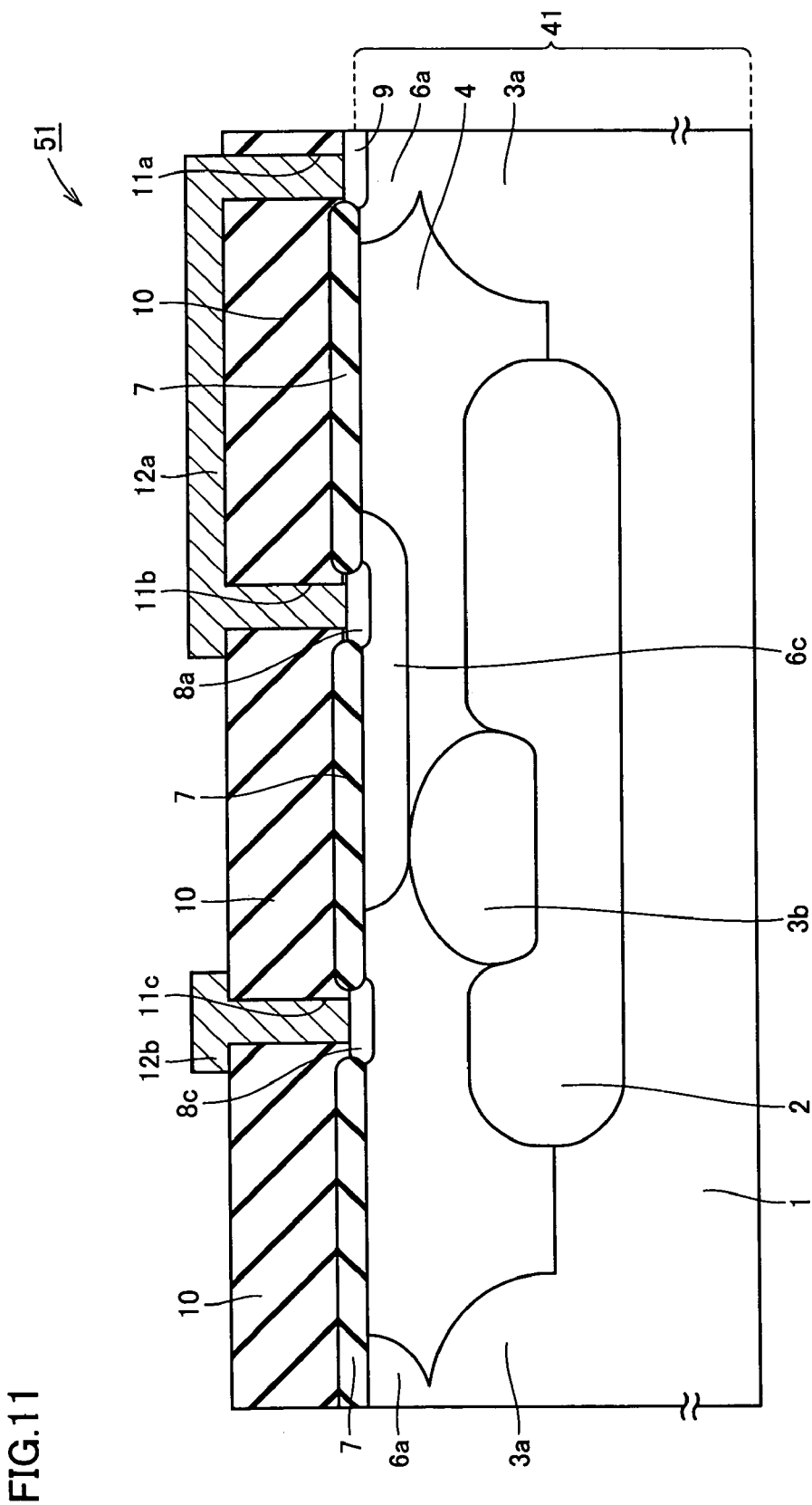
FIG. 11 is a cross-sectional view along line XI—XI in FIG. 10.

Referring to FIGS. 10 and 11, diode 22 is configured as described below according to this embodiment.

Specifically, in diode 22, the anode region is constituted of p⁺ diffusion layer 3b formed in n⁻ epitaxial layer 4 and p-type diffusion layer 6c formed in n⁻ epitaxial layer 4. The cathode region is constituted of n⁺ diffusion layer 8c (first cathode region) formed in n⁻ epitaxial layer 4, n⁻ epitaxial layer 4 and n⁺ diffusion layer 2 (second cathode region). P-type diffusion layer 6c is formed in n⁻ epitaxial layer 4 to extend and contact p⁺ diffusion layer 3b. It is noted that n-type diffusion layer 5 and p-type diffusion layer 6b are not formed.

According to this embodiment, a pn junction where Zener breakdown occurs is constituted of p⁺ diffusion layer 3b and n⁺ diffusion layer 2. P⁺ diffusion layer 3b and n⁺ diffusion layer 2 are both formed within n⁻ epitaxial layer 4 (lower side in FIG. 11) and the pn junction where Zener breakdown occurs is distant from field oxide film 7.

It is noted that the configuration here is almost similar to that of the first embodiment shown in FIGS. 1–3 except for the above-discussed details. The same components are thus denoted by the same reference character and description thereof is not repeated here.

According to this embodiment, the pn junction where Zener breakdown occurs is formed of p⁺ diffusion layer 3b and n⁺ diffusion layer 2 that are both regions of high impurity concentration respectively. P⁺ diffusion layer 3b of the pn junction, however, locally has a lower impurity concentration for the following reason.

Specifically, p⁺ diffusion layer 3b is formed by implantation of B into p⁻ region 1 with an implantation dose, for example, of approximately $10^{14}$ ions/cm² and heat treatment at a temperature, for example, of 1150° C. N⁺ diffusion layer 2 is formed by implantation of Sb (antimony) into p⁻ region 1 with an implantation dose, for example, of approximately $10^{15}$ ions/cm² and heat treatment at a temperature, for example, of 1180° C. Here, as Sb has a lower diffusion coefficient than that of B, diffusion of Sb allows n⁺ diffusion layer 2 to be formed near p⁻ region 1. On the other hand, as B has a higher diffusion coefficient than that of Sb, diffusion of B allows p⁺ diffusion layer 3b to be formed in a region closer to the surface of substrate 41 relative to n⁺ diffusion layer 2 (upper region in FIG. 11). In p⁺ diffusion layer 3b thus produced, there is a difference in impurity concentration. In other words, in p⁺ diffusion layer 3b, the region near the surface of semiconductor substrate 41 (upper side in FIG. 11) locally has a high impurity concentration of B. On the other hand, in the pn junction with n⁺ diffusion layer 2, p⁺ diffusion layer 3b locally has a low impurity concentration of B and thus the depletion layer of the pn junction has an increased width. Then, the semiconductor device having the surge protection circuit without suffering from current leakage and operating normally can be obtained.

Further, according to this embodiment, p⁺ diffusion layer 3b and n⁺ diffusion layer 2 constituting the pn junction where Zener breakdown occurs are both formed in n⁻ epitaxial layer 4 formed in semiconductor substrate 41. Accordingly, the pn junction where Zener breakdown occurs is formed within semiconductor substrate 41 (on the lower side in FIG. 11) and heat generated in surge protection circuit 31 can efficiently be discharged to semiconductor substrate 41.

Sixth Embodiment

Figure 12:
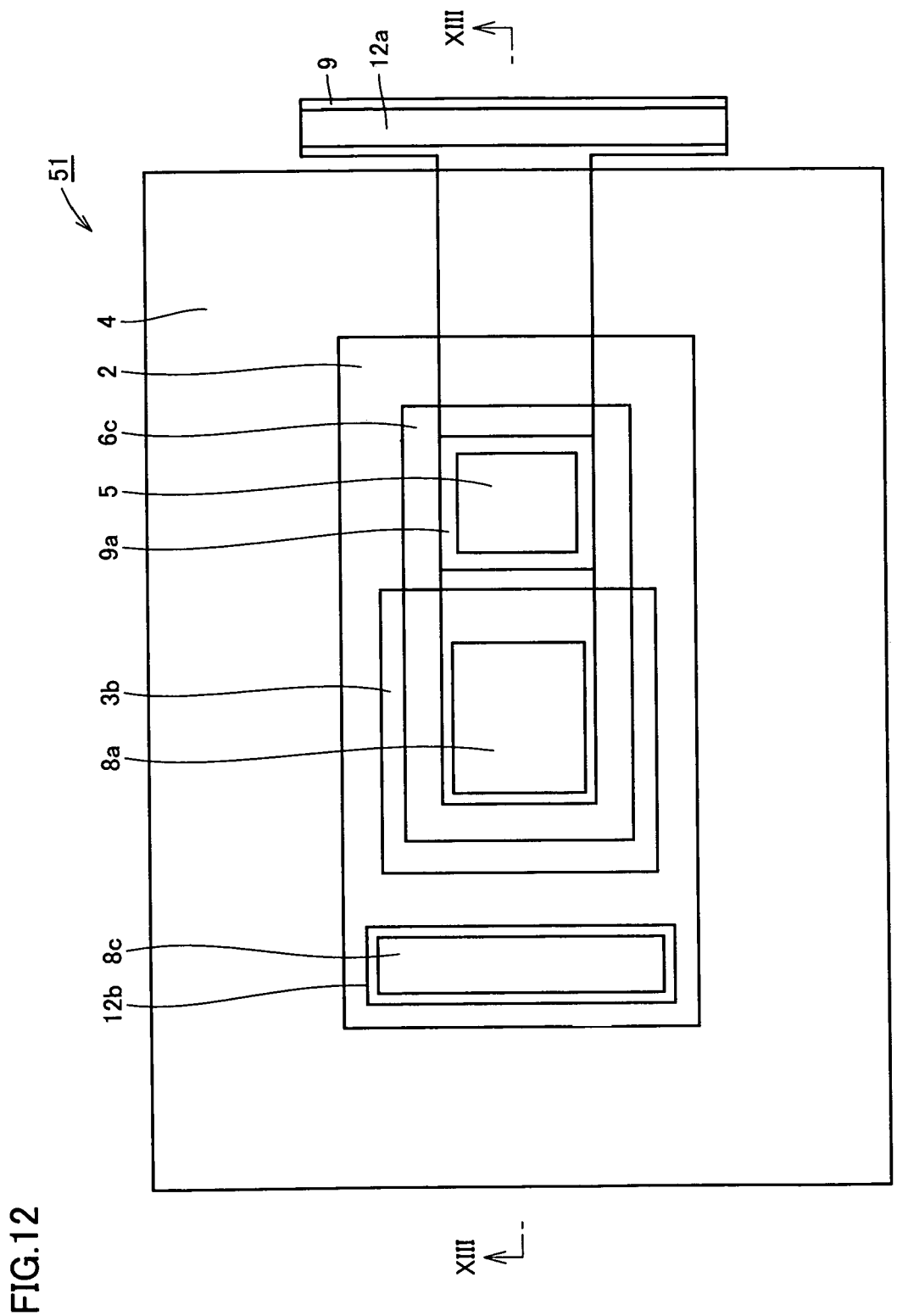
FIG. 12 is a plan view schematically showing a configuration of a semiconductor device having a surge protection circuit in a sixth embodiment of the present invention.
Figure 13:
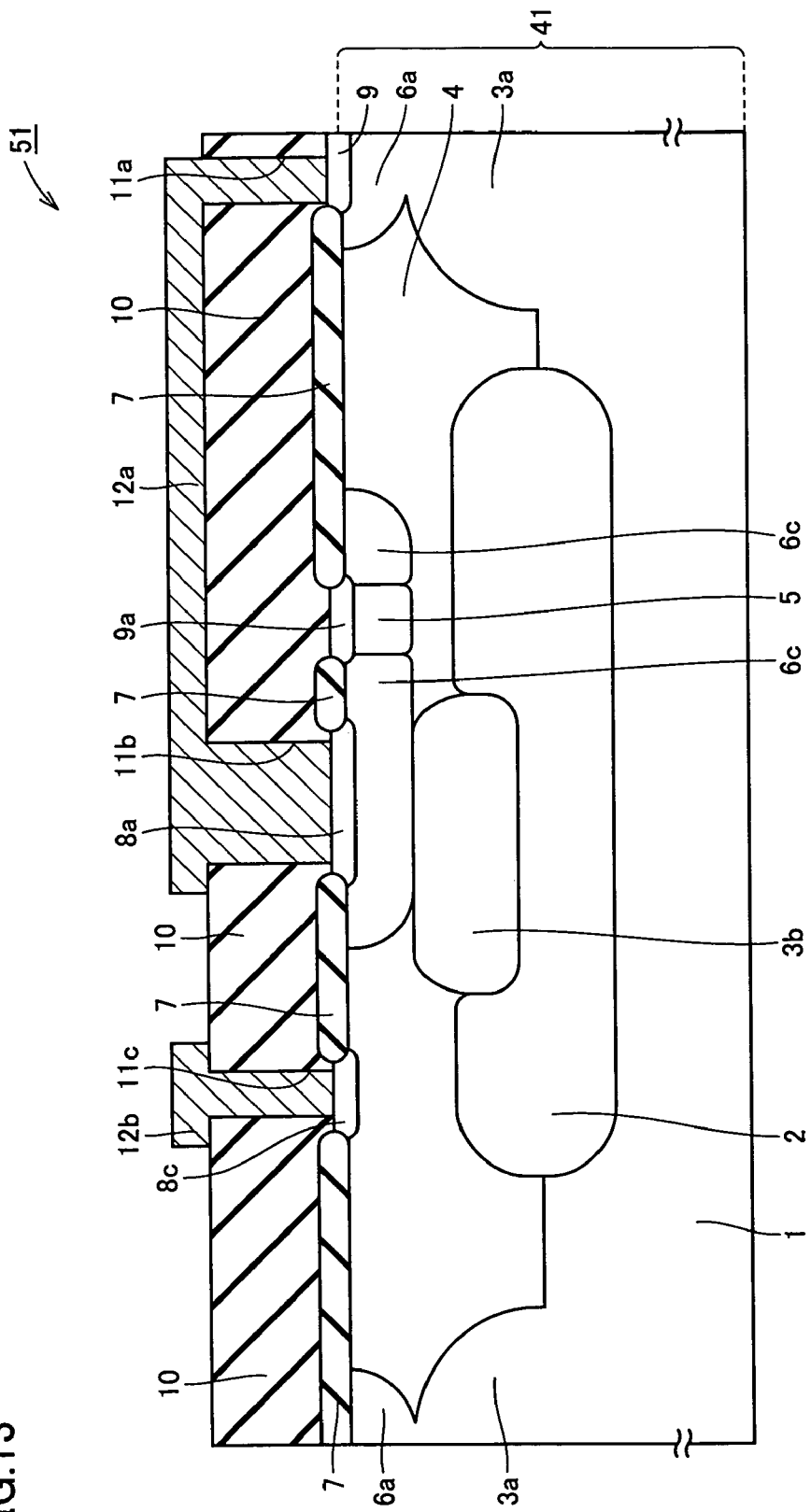
FIG. 13 is a cross-sectional view along line XIII—XIII in FIG. 12.

Referring to FIGS. 12 and 13, according to this embodiment, npn transistor 23 is configured as described below.

In npn transistor 23, the collector region is constituted of n⁺ diffusion layer 8c formed in n⁻ epitaxial layer 4, n⁻ epitaxial layer 4 and n⁺ diffusion layer 2 (first buried layer). The base region is constituted of p⁺ diffusion layer 3b (second buried layer) formed in n⁻ epitaxial layer 4 and p-type diffusion layer 6c formed in n⁻ epitaxial layer 4. The emitter region is constituted of n⁺ diffusion layer 8a formed in p-type diffusion layer 6c. N⁺ diffusion layer 2 and p⁺ diffusion layer 3b are adjacent to each other.

It is noted that the configuration here is almost similar to that of the fourth embodiment shown in FIGS. 8 and 9 except for the above-discussed details. The same components are thus denoted by the same reference character and description thereof is not repeated here.

In semiconductor device 51 having the surge protection circuit of this embodiment, when diode 22 encounters Zener breakdown due to a surge voltage, current flows in npn transistor 23 as described below. Current which flows in the collector region from n⁺ diffusion layer 8c through n⁻ epitaxial layer 4 to n⁺ diffusion layer 2 then flows via p⁺ diffusion layer 3b and p-type diffusion layer 6c to n⁺ diffusion layer 8a. In npn transistor 23, n⁺ diffusion layer 2 and p⁺ diffusion layer 3b are adjacent to each other and thus n⁺ diffusion layer 2 and p⁺ diffusion layer 3b form a junction between the collector and the base. In this way, n⁺ diffusion layer 2 which is higher in impurity concentration than n⁻ epitaxial layer 4 can serve as the junction with the base.

In semiconductor device 51 having the surge protection circuit of this embodiment, the collector of npn transistor 23 has n⁻ epitaxial layer 4 formed in the semiconductor substrate and n⁺ diffusion layer 2 formed in n⁻ epitaxial layer 4, and the base of npn transistor 23 has p⁺ diffusion layer 3b formed in n⁻ epitaxial layer 4. The impurity concentration of n⁺ diffusion layer 2 is higher than that of n⁻ epitaxial layer 4 and is adjacent to p⁺ diffusion layer 3b.

As n⁺ diffusion layer 2 having the higher impurity concentration than that of n⁻ epitaxial layer 4 forms the junction with the base, this arrangement helps the current to concentratedly flow to the junction surface between the collector region and the base region. Thus, the current flows from the collector region to the base region more easily so that a larger current can be released.

Figure 14:
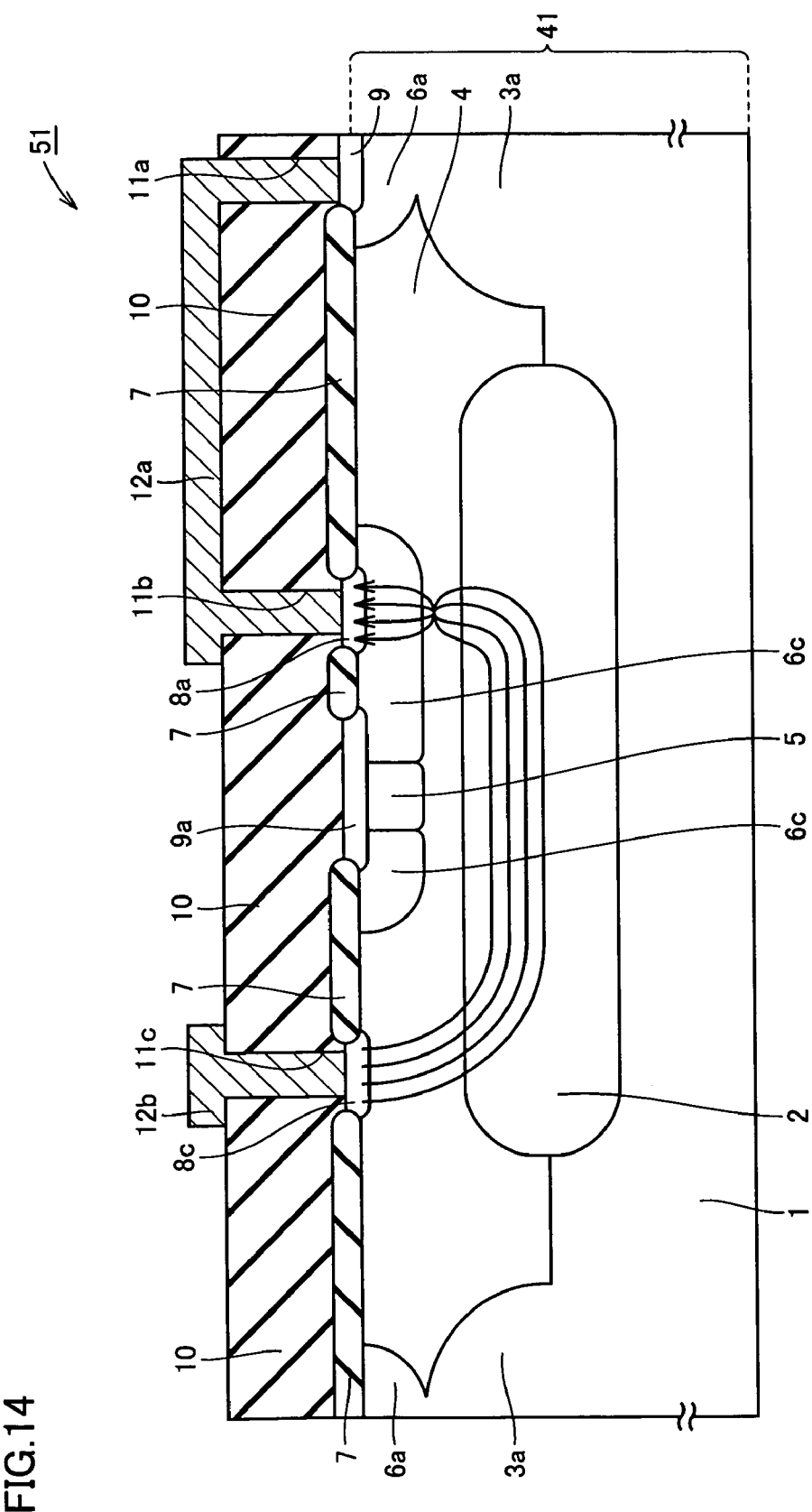
FIG. 14 schematically shows a current flow in the semiconductor device having the surge protection circuit in the fourth embodiment of the present invention.
Figure 15:
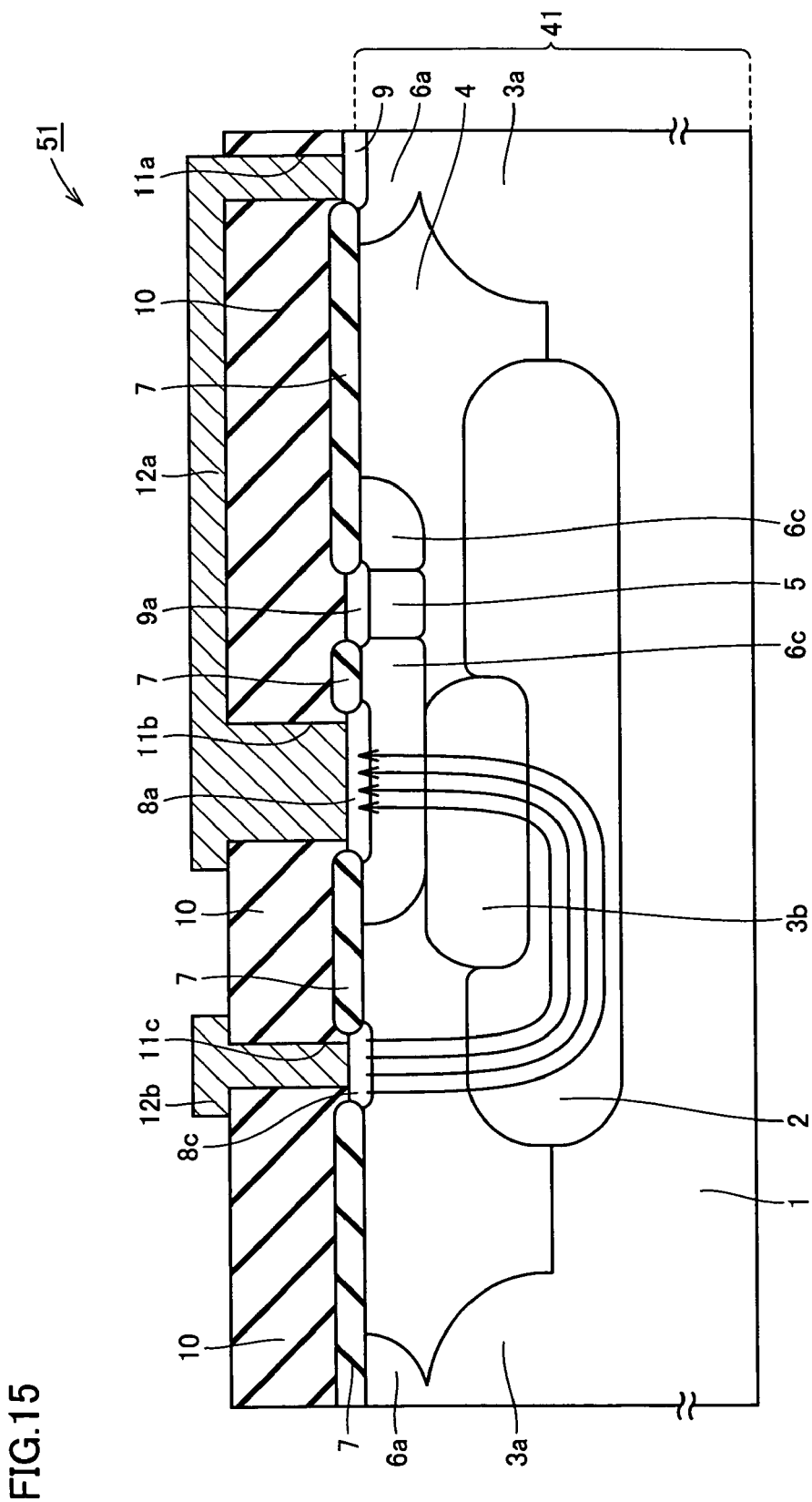
FIG. 15 schematically shows a current flow in the semiconductor device having the surge protection circuit in the sixth embodiment of the present invention.

Referring to FIG. 14, in the semiconductor device of the fourth embodiment, $n^-$ epitaxial layer 4 serves as the junction with the base region. Since $n^-$ epitaxial layer 4 is higher in resistance than $n^+$ diffusion layer 2, the current concentrates more easily in the collector region (current density is more likely to increase) as compared with the semiconductor device of the sixth embodiment, so that there is generated a region where the current less easily flows in the collector region. In contrast, with reference to FIG. 15, in the semiconductor device of the sixth embodiment, $n^+$ diffusion layer 2 having a higher impurity concentration than that of $n^-$ epitaxial layer 4 serves as the junction with the base region. Therefore, the current is not concentrated in the collector region (no increase of the current density) and the current easily flows in the corrector region.

In order to ascertain the above-described effect, the inventors of the present invention performed a simulation, for each of respective semiconductor devices of the fourth embodiment and the sixth embodiment, regarding the electric-field intensity generated by electric current in the direction of depth of directly under the emitter region.

Figure 16:
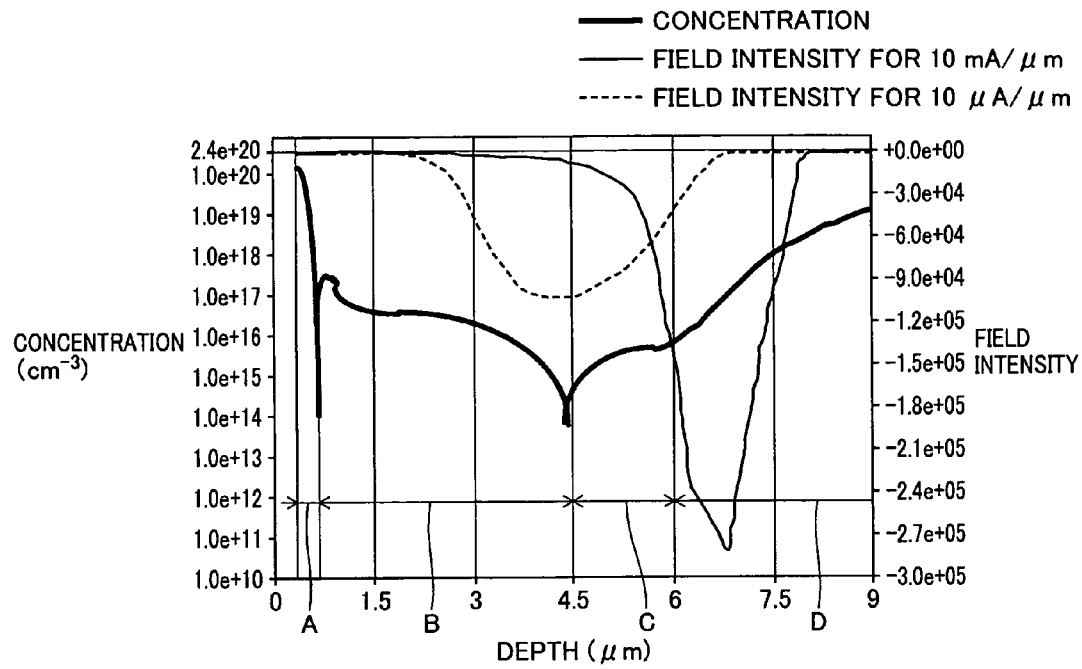
FIG. 16 shows results of a simulation for the concentration profile directly under the emitter region and the field intensity in the direction of depth directly under the emitter region of the semiconductor device according to the fourth embodiment of the present invention.
Figure 17:
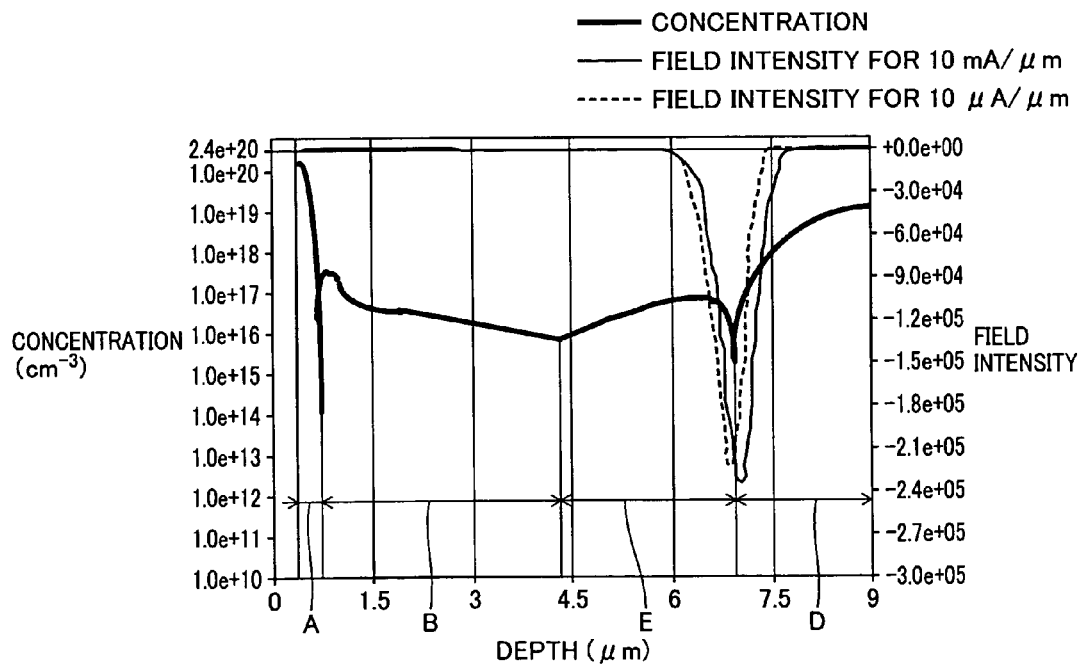
FIG. 17 shows results of a simulation for the concentration profile directly under the emitter region and the field intensity in the direction of depth directly under the emitter region of the semiconductor device according to the sixth embodiment of the present invention.

Referring to FIGS. 16 and 17, results of the simulations are shown where the density of the current flowing through semiconductor device 51 is 10 µA/µm and 10 mA/µm. In FIGS. 16 and 17, the region indicated by A is the region where $n^+$ diffusion layer 8a is formed, the region indicated by B is the region where p-type diffusion layer 6c is formed, the region indicated by C is the region where $n^-$ epitaxial layer 4 is formed, the region indicated by D is the region where $n^+$ diffusion layer 2 is formed, and the region indicated by E is the region where $p^+$ diffusion layer 3b is formed.

Referring to FIG. 16, when the current density is 10 µA/µm, the absolute value of the field intensity is the maximum at a depth of approximately 6.8 µm in $n^+$ diffusion layer 2. The portion where the absolute value of the field intensity is large is the region where concentrated flow of current is unlikely. From this result, it is seen that there is the region in $n^+$ diffusion layer 2 where current less easily flows particularly when large current flows in the semiconductor device.

Referring to FIG. 17, the absolute value of the field intensity is the maximum at a depth of approximately 7.0 µm located near the junction surface between $p^+$ diffusion layer 3b and $n^+$ diffusion layer 2 for both of the current density of 10 µA/µm and that of 10 mA/µm. Thus, it is seen that current easily flows in $n^+$ diffusion layer 2 of semiconductor device 51 of the sixth embodiment.

Seventh Embodiment

Figure 18:
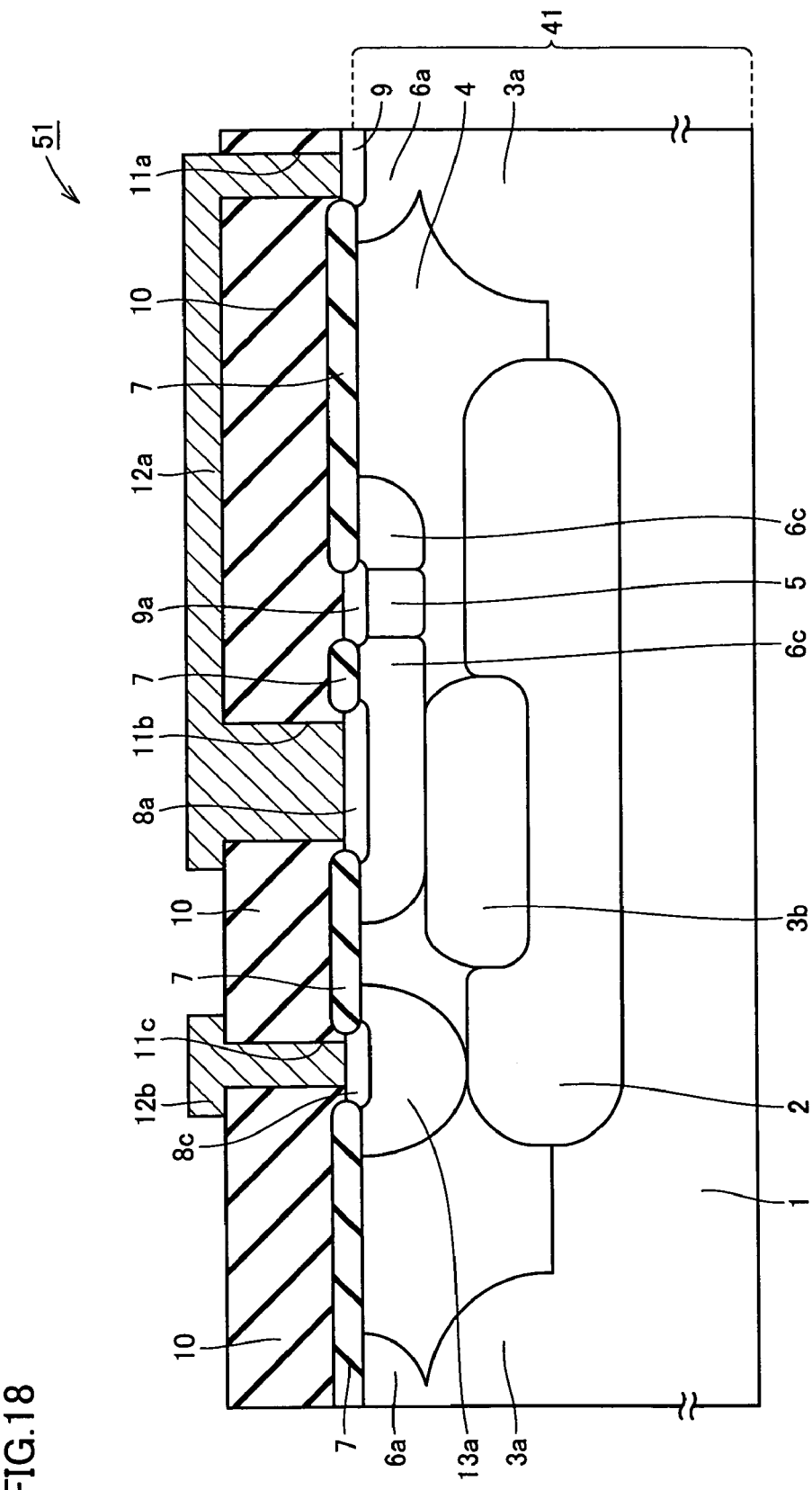
FIG. 18 is a cross-sectional view schematically showing a configuration of a semiconductor device having a surge protection circuit in a seventh embodiment of the present invention.

Referring to FIG. 18, according to this embodiment, an $n^+$ diffusion layer 13a is formed in $n^-$ epitaxial layer 4 to enclose $n^+$ diffusion layer 8c. $N^+$ diffusion layer 13a is formed by implantation and diffusion of, for example, phosphorus glass into $n^-$ epitaxial layer 4 so as to reach $n^+$ diffusion layer 2. The collector region of npn transistor 23 is thus constituted of $n^+$ diffusion layer 8c, $n^+$ diffusion layer 13a, $n^+$ diffusion layer 2 and $n^-$ epitaxial layer 4. $N^+$ diffusion layer 13a has its impurity concentration higher than that of $n^-$ epitaxial layer 4.

It is noted that the configuration here is almost similar to that of the sixth embodiment shown in FIGS. 12 and 13 except for the above-described details. The same components are thus denoted by the same reference character and description thereof is not repeated here.

In semiconductor device 51 having the surge protection circuit of this embodiment, $n^+$ diffusion layer 13a is added to the components of the collector region of npn transistor 23. As the $n^+$ diffusion layer has a higher impurity concentration than that of the $n^-$ epitaxial layer, the electrical resistance of the collector region (collector resistance) is low. The transistor can accordingly have an improved operating speed and the surge protection circuit can operate even when a surge of high frequency occurs.

Eighth Embodiment

Figure 19:
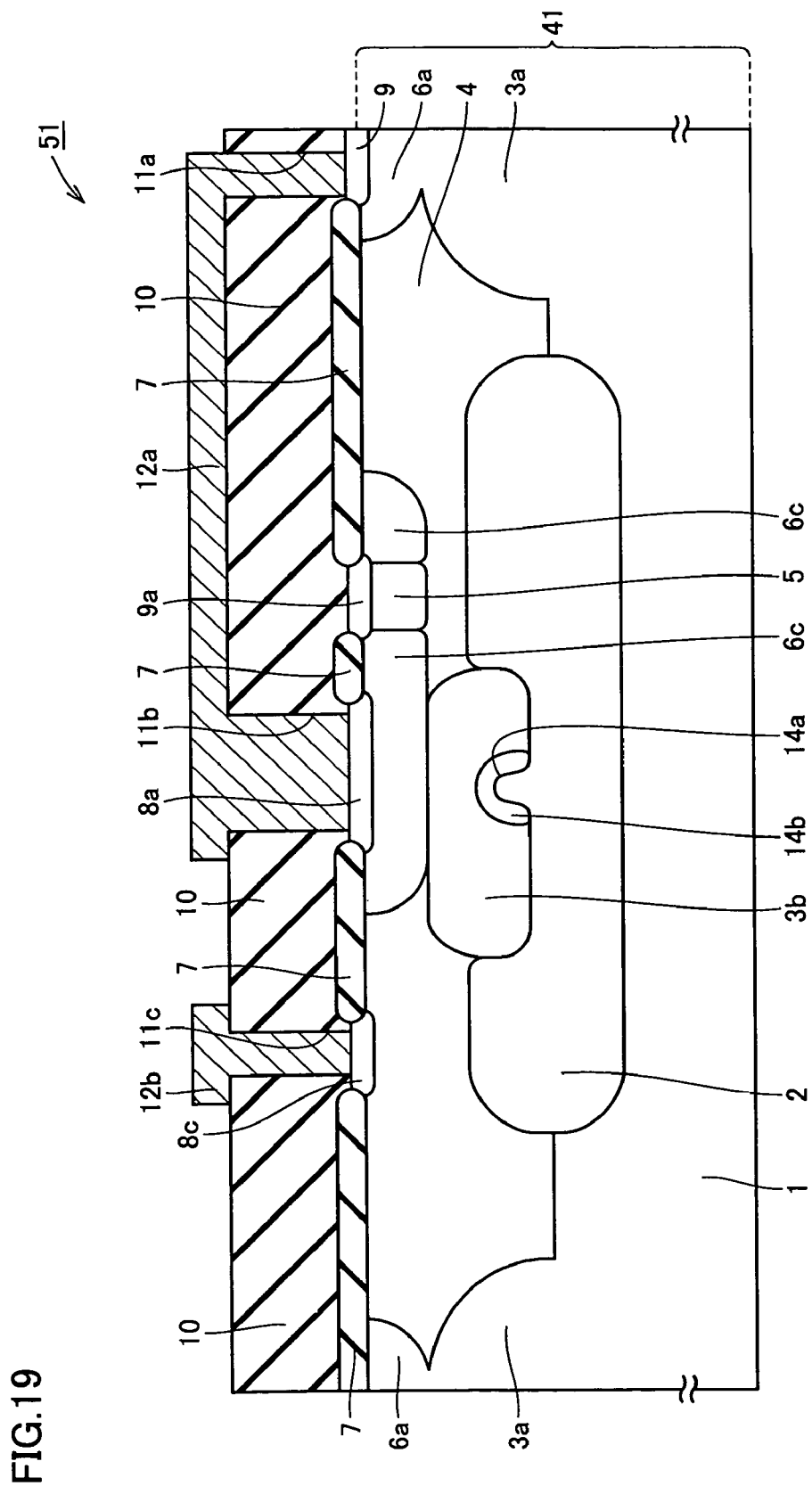
FIG. 19 is a cross-sectional view schematically showing a configuration of a semiconductor device having a surge protection circuit in an eighth embodiment of the present invention.

Referring to FIG. 19, according to this embodiment, $p^+$ diffusion layer 3b located directly under $n^+$ diffusion layer 8a has a part where a recess 14a is formed. Recess 14a is adjacent to $n^+$ diffusion layer 2 so that $n^+$ diffusion layer 2 is formed to enter recess 14a. Recess 14a is formed, in the process of implanting impurities into $n^+$ diffusion layer 2 and $n^-$ epitaxial layer 4 for the purpose of producing $p^+$ diffusion layer 3b, by preventing the impurities from being implanted into the region of recess 14a. Since recess 14a is formed in this way, $p^+$ diffusion layer 3b has, around recess 14a, a low-concentration region 14b where the concentration of p-type impurities is locally low.

It is noted that the configuration here is almost similar to that of the sixth embodiment shown in FIGS. 12 and 13 except for the above-described details. The same components are thus denoted by the same reference character and description thereof is not repeated here.

In semiconductor device 51 having the surge protection circuit of this embodiment, $p^+$ diffusion layer 3b has low-concentration region 14b where the impurity concentration is relatively low, in the region adjacent to the $n^-$ epitaxial layer.

Accordingly, low-concentration region 14b to be formed can be sized to adjust the resistance of the base region contacting the collector. The resistance of the base region can thus be adjusted to adjust the amount of current flowing through the semiconductor device.

In order to ascertain the above-described effect, the inventors of the present invention performed a simulation for semiconductor device 51 of this embodiment regarding the electric-field intensity generated by electric current of a region directly under the emitter region.

Figure 20:
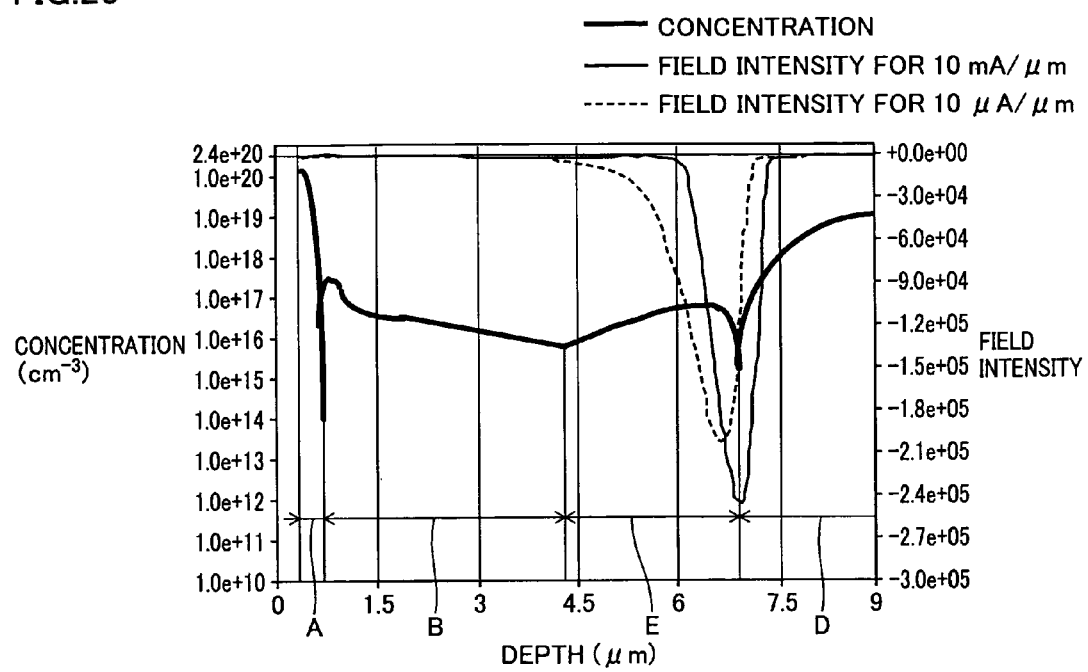
FIG. 20 shows results of a simulation for the concentration profile directly under the emitter region and the field intensity in the direction of depth directly under the emitter region of the semiconductor device according to the eighth embodiment of the present invention.

FIG. 20 shows results of the simulation where the density of the current flowing through the semiconductor device is 10 µA/µm and 10 mA/µm. In FIG. 20, the region indicated by A is the region where $n^+$ diffusion layer 8a is formed, the region indicated by B is the region where p-type diffusion layer 6c is formed, the region indicated by D is the region where $n^+$ diffusion layer 2 is formed, and the region indicated by E is the region where $p^+$ diffusion layer 3b is formed.

Referring to FIG. 20, when the current density is 10 µA/µm, the width of the field intensity is larger as compared with the simulation results of the sixth embodiment shown in FIG. 17. As the width of the field intensity is larger, the region where the current less easily flows is greater. It is thus seen from this result that the amount of current flowing through the semiconductor device can be adjusted with low concentration region 14b particularly when the current flowing through the semiconductor device is small.

Ninth Embodiment

Figure 21:
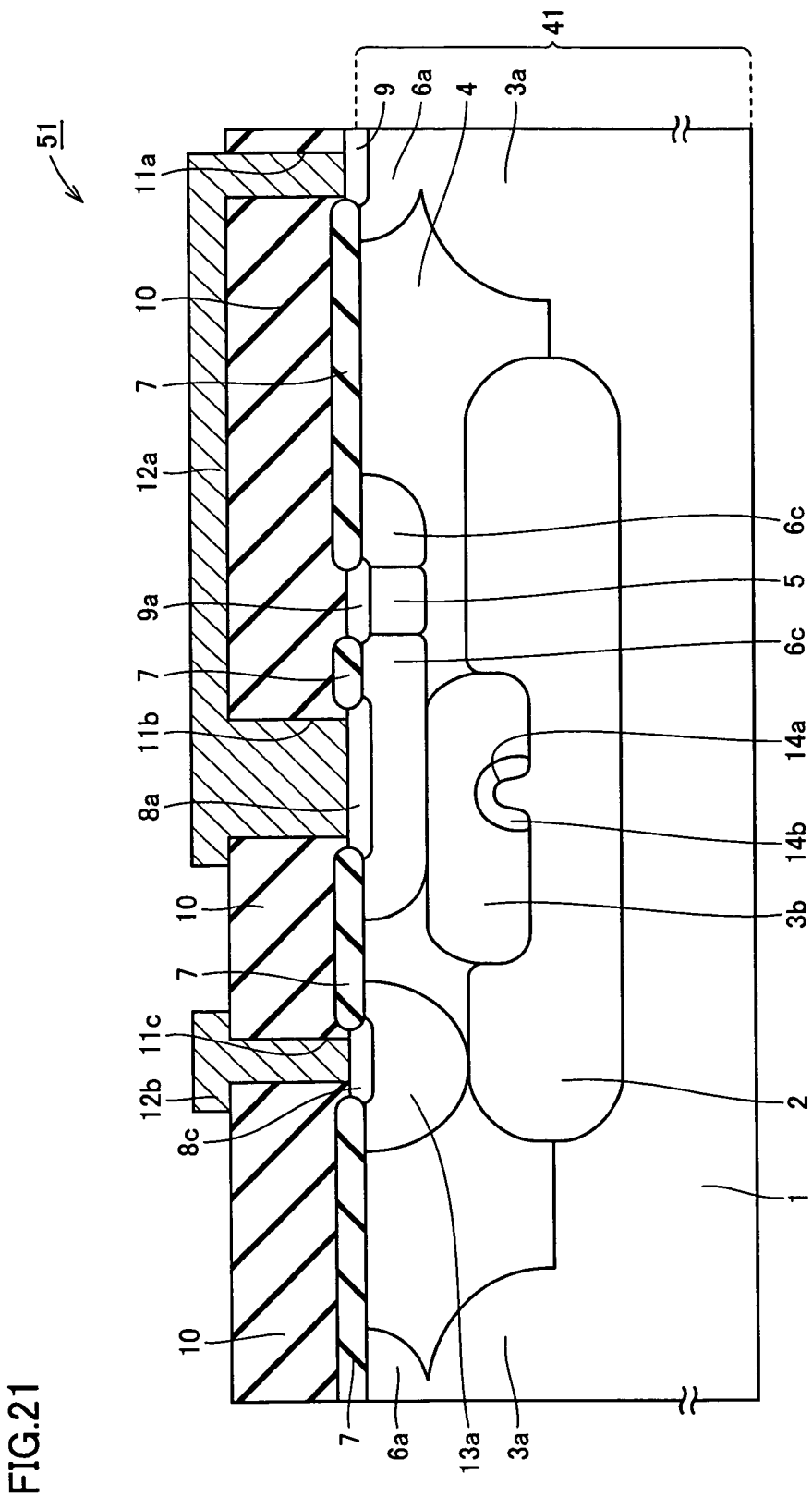
FIG. 21 is a cross-sectional view schematically showing a configuration of a semiconductor device having a surge protection circuit in a ninth embodiment of the present invention.

Referring to FIG. 21, according to this embodiment, an $n^+$ diffusion layer 13a is formed in $n^-$ epitaxial layer 4 to enclose $n^+$ diffusion layer 8c. $N^+$ diffusion layer 13a is formed by implantation and diffusion of, for example, phosphorus glass into n⁻ epitaxial layer 4 so as to reach n⁺ diffusion layer 2. The collector region of npn transistor 23 is thus constituted of n⁺ diffusion layer 8c, n⁺ diffusion layer 13a, n⁺ diffusion layer 2 and n⁻ epitaxial layer 4. N⁺ diffusion layer 13a has its impurity concentration higher than that of n⁻ epitaxial layer 4.

It is noted that the configuration here is almost similar to that of the eighth embodiment shown in FIG. 19 except for the above-described details. The same components are thus denoted by the same reference character and description thereof is not repeated here.

In semiconductor device 51 having the surge protection circuit of this embodiment, n⁺ diffusion layer 13a is added to the components of the collector region of npn transistor 23. As the n⁺ diffusion layer has a higher impurity concentration than that of the n⁻ epitaxial layer, the electrical resistance of the collector region (collector resistance) is low. The transistor can accordingly have an improved operating speed and the surge protection circuit can operate even when a surge of high frequency occurs.

Tenth Embodiment

Figure 22:
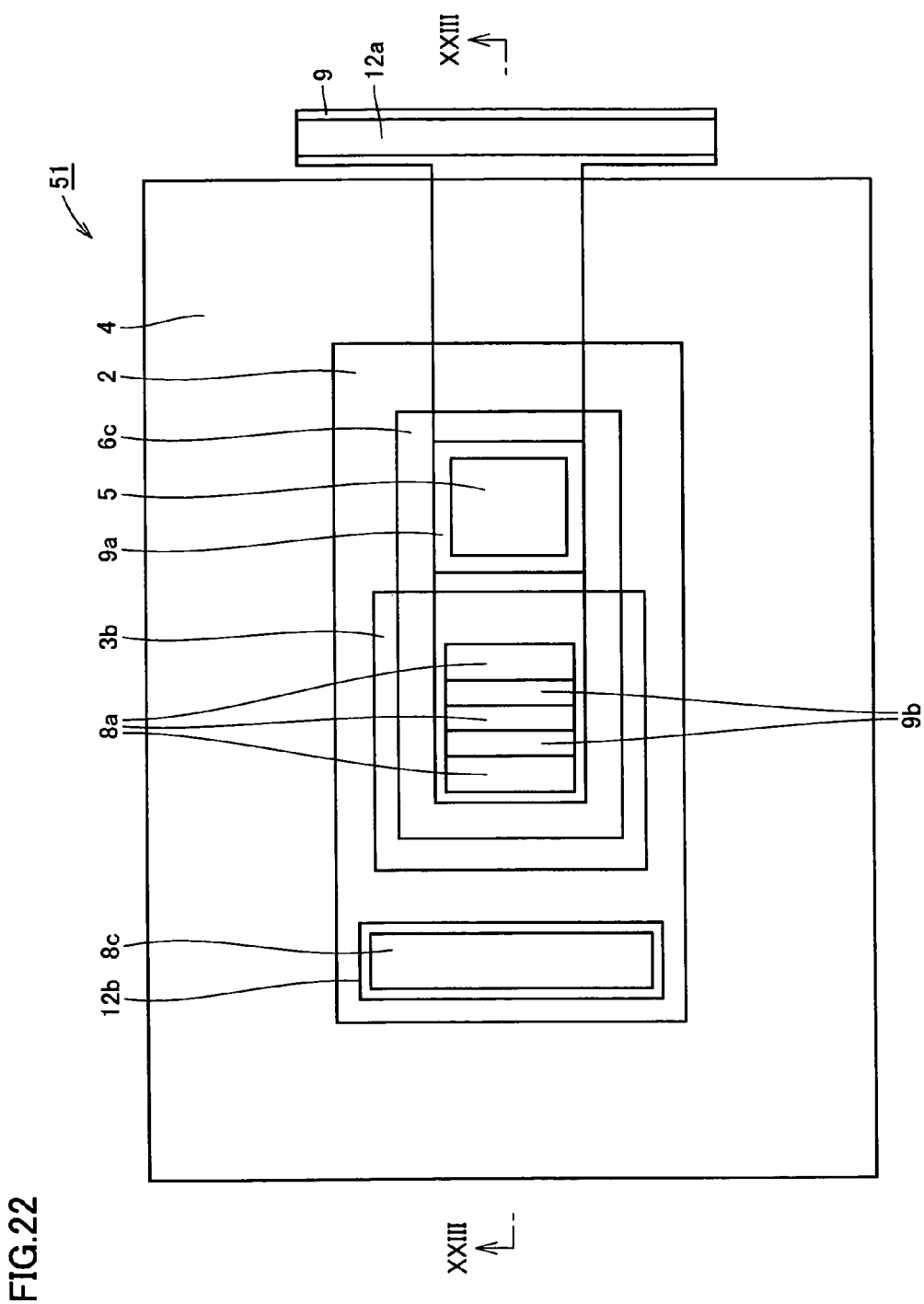
FIG. 22 is a plan view schematically showing a configuration of a semiconductor device having a surge protection circuit in a tenth embodiment of the present invention.
Figure 23:
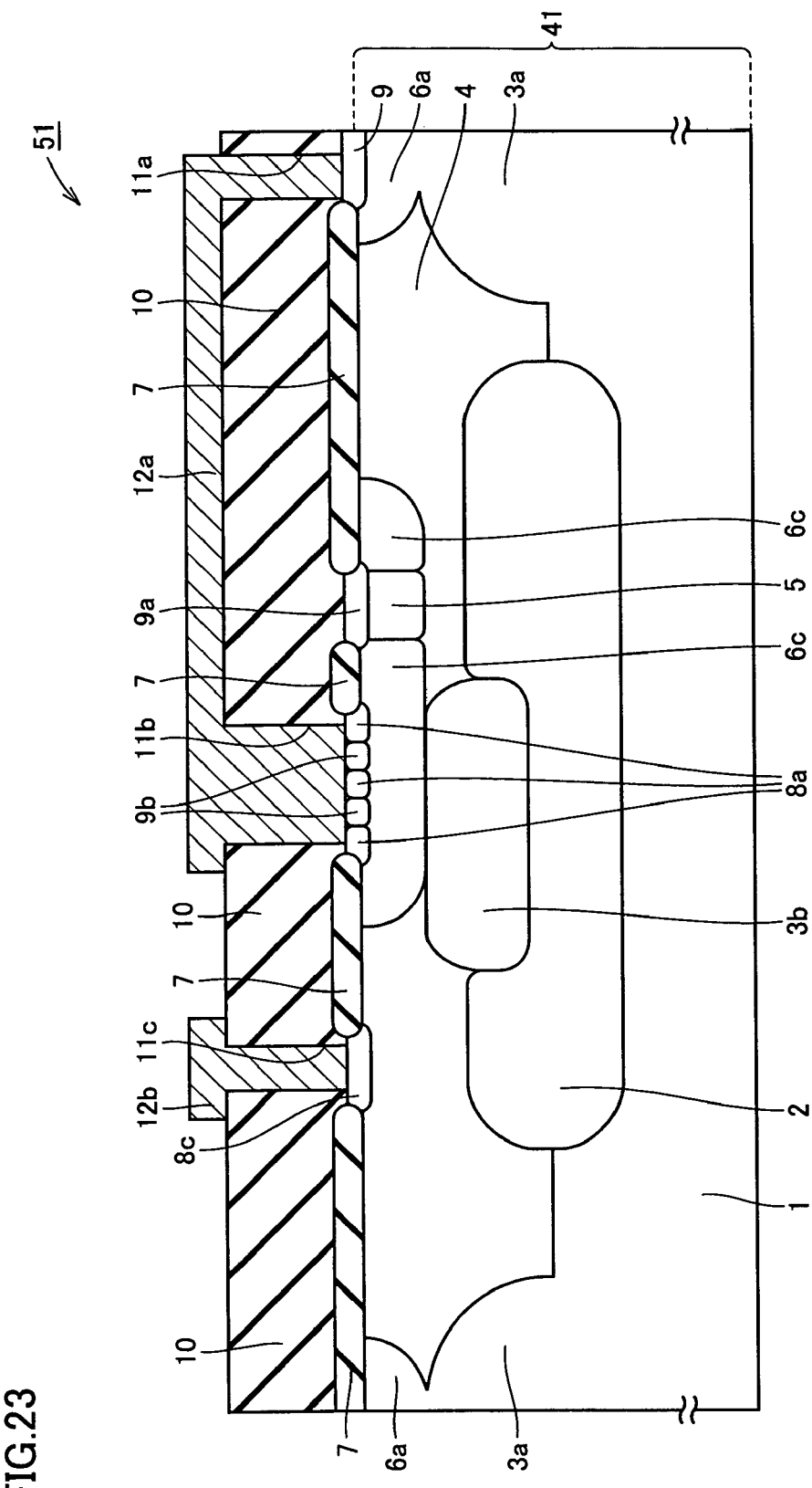
FIG. 23 is a cross-sectional view along line XXIII—XXIII in FIG. 22.

Referring to FIGS. 22 and 23, according to this embodiment, n⁺ diffusion layer 8a constituting the emitter region of npn transistor 23 is shaped differently from that of the sixth embodiment. Specifically, two p⁺ diffusion layers 9b are formed in p-type diffusion layer 6c to divide n⁺ diffusion layer 8a into three regions. Two p⁺ diffusion layers 9b each have a rectangular and planer shape extending in the longitudinal direction for example in FIG. 22. N⁺ diffusion layers 8a and p⁺ diffusion layers 9b are both connected electrically to interconnection 12a (second conductive layer). Further, the base region of npn transistor 23 is constituted of p⁺ diffusion layer 3b formed in n⁻ epitaxial layer 4, p-type diffusion layer 6c formed in n⁻ epitaxial layer 4, and p⁺ diffusion layers 9b formed in p-type diffusion layer 6c.

It is noted that the configuration here is almost similar to that of the sixth embodiment shown in FIGS. 12 and 13 except for the above-described details. The same components are thus denoted by the same reference character and description thereof is not repeated here.

In semiconductor device 51 having the surge protection circuit of this embodiment, p⁺ diffusion layers 9b serving as the base region of npn transistor 23 and n⁺ diffusion layers 8a serving as the emitter region thereof are both connected electrically to interconnection 12a.

Accordingly, the current flowing through p-type diffusion layer 6c which is the base region flows into interconnection 12a through p⁺ diffusion layers 9b to decrease the electron density of p-type diffusion layer 6c so that the current less easily flows from the collector region to the emitter region in npn transistor 23. Then, p⁺ diffusion layers 9b can be sized to adjust the amount of current flowing through the semiconductor device.

In order to ascertain the above-described effect, the inventors of the present invention performed a simulation regarding the electron density in the direction of depth directly under the emitter region of semiconductor device 51 of this embodiment.

Figure 24:
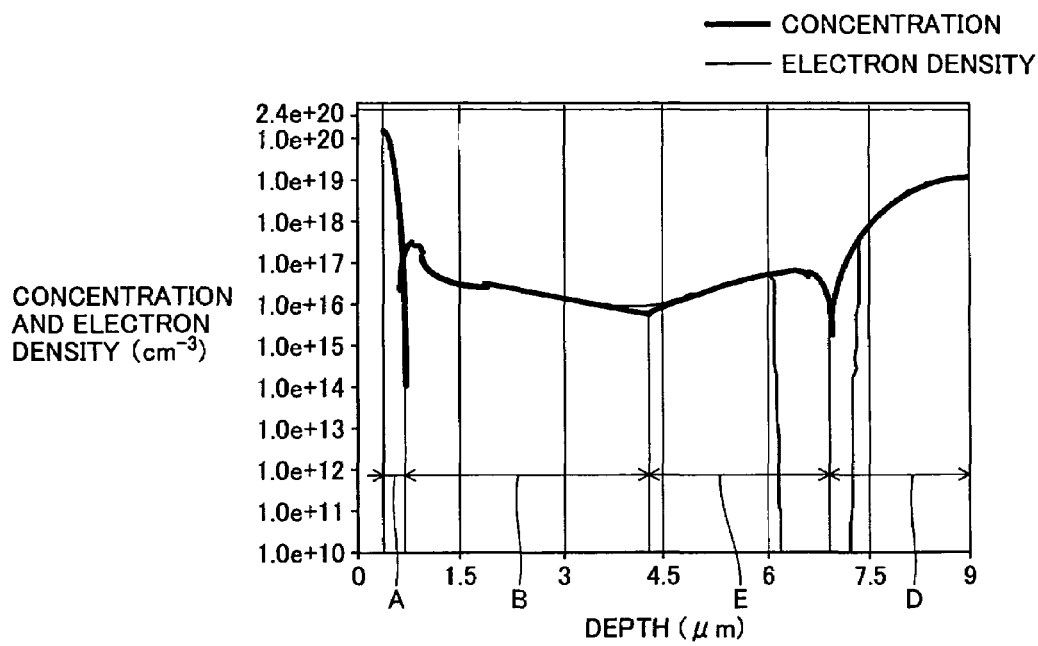
FIG. 24 shows results of a simulation for the concentration profile directly under the emitter region and the field intensity in the direction of depth directly under the emitter region of the semiconductor device according to the tenth embodiment of the present invention.

In FIG. 24, the region indicated by A is the region where n⁺ diffusion layer 8a is formed, the region indicated by B is the region where p-type diffusion layer 6c is formed, the region indicated by D is the region where n⁺ diffusion layer 2 is formed, and the region indicated by E is the region where p⁺ diffusion layer 3b is formed.

Referring to FIG. 24, a considerable decrease of the electron density is found in the region from the depth of approximately 6.2 μm in p⁺ diffusion layer 3b to the depth of approximately 7.0 μm near the junction surface between p⁺ diffusion layer 3b and n⁺ diffusion layer 2. It is thus seen that the current flowing through p-type diffusion layer 6c flows to interconnection 12a through p⁺ diffusion layers 9b.

The inventors further performed a simulation regarding the relation between the voltage applied to the semiconductor device and the current flowing through the semiconductor device by changing the number of p⁺ diffusion layers 9b (slits) in semiconductor device 51 of this embodiment.

Figure 25:
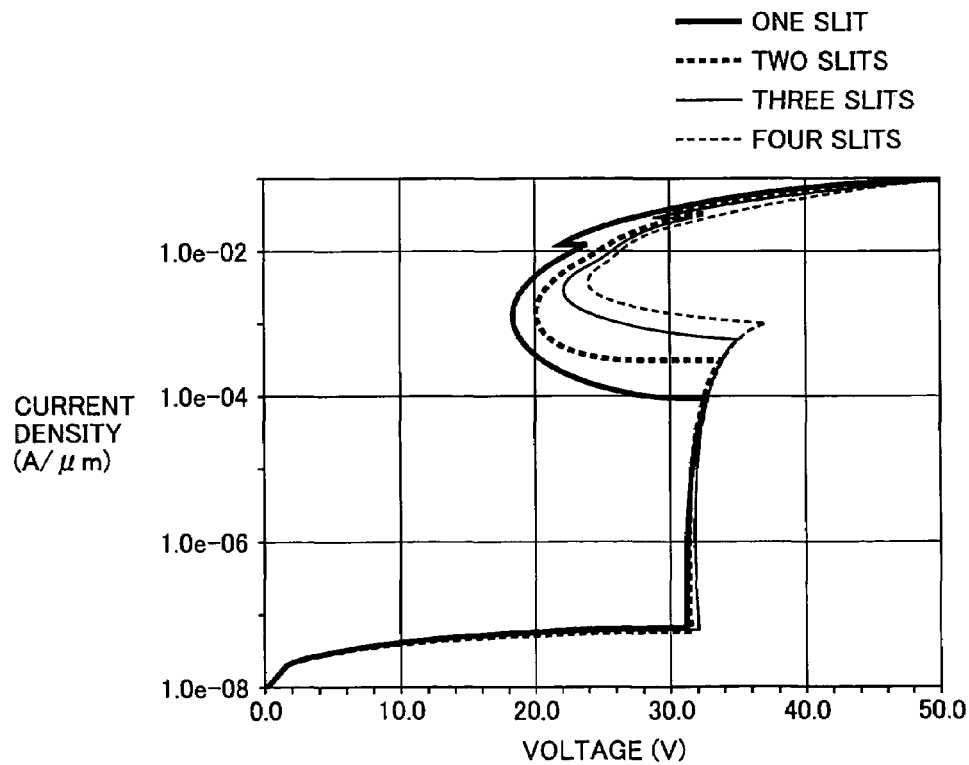
FIG. 25 shows results of a simulation as to the relation between the voltage applied to the semiconductor device and the density of current flowing through the semiconductor device according to the tenth embodiment of the present invention.

Referring to FIG. 25, when the current density is $1\times10^{-4}$ A/μm or higher, the current flowing through the semiconductor device increases as the number of slits increases (the size of p⁺ diffusion layer(s) 9b increases). It is seen from this result that, particularly when large current flows through the semiconductor device, the amount of current flowing through the semiconductor device can be adjusted by providing an appropriate number of p⁺ diffusion layers 9b (slits) formed in p-type diffusion layer 6c.

Further, the inventors performed simulations regarding the relation between the voltage applied to the semiconductor device and the current flowing through the semiconductor device for each of the fourth, sixth, eighth and tenth embodiments of the present invention.

Figure 26:
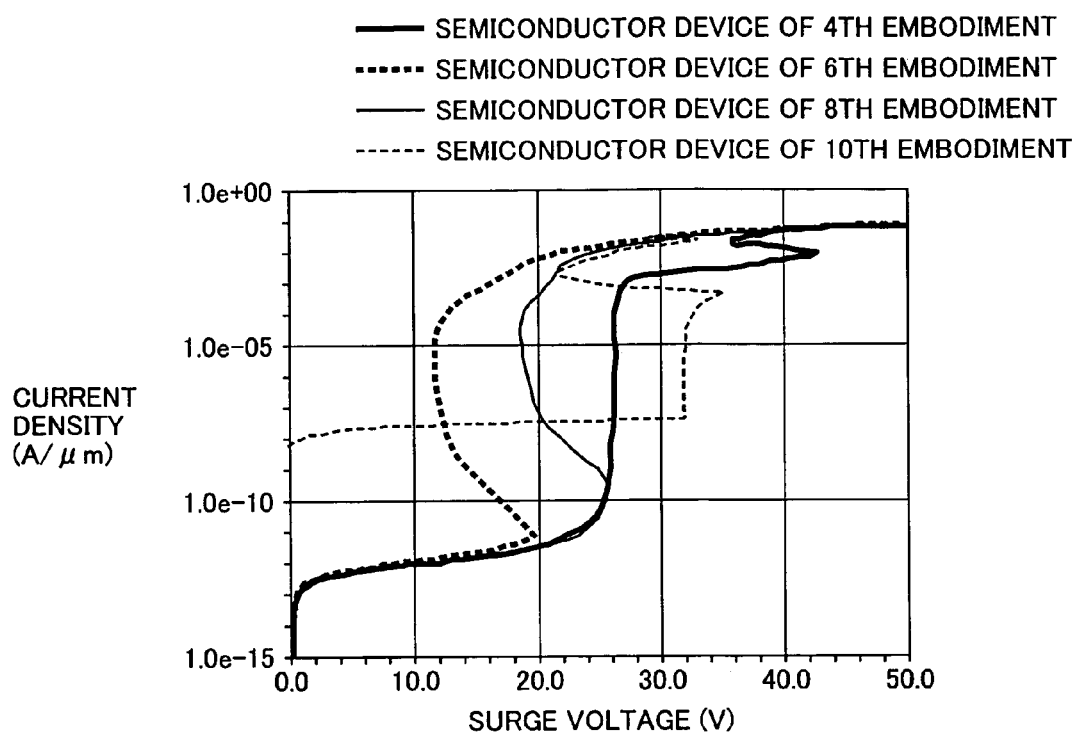
FIG. 26 shows results of a simulation as to the relation between the voltage applied to a semiconductor device and the density of current flowing through the semiconductor device.

Referring to FIG. 26, as to the semiconductor device of the sixth embodiment, the voltage is approximately 11.0 V when the current density is $1\times10^{-4}$ A/μm. As to the semiconductor device of the fourth embodiment, the voltage is approximately 26.0 V when the current density is $1\times10^{-4}$ A/μm. From the results, it is seen that the current more easily flows in the semiconductor device of the sixth embodiment than in the semiconductor device of the fourth embodiment particularly when large current flows through the semiconductor device. Further, as to the semiconductor device of the eighth embodiment, the voltage is approximately 26.0 V when the current density is $1\times10^{-10}$ A/μm. As to the semiconductor device of the sixth embodiment, the voltage is approximately 16.0 V when the current density is $1\times10^{-10}$ A/μm. From the results, it is seen that the current more easily flows in the semiconductor device of the eighth embodiment than in the semiconductor device of the sixth embodiment particularly when small current flows through the semiconductor device and that the amount of the flowing current can be adjusted. Moreover, as to the semiconductor device of the tenth embodiment, the voltage is approximately 32.0 V when the current density is $1\times10^{-7}$ A/μm. As to the semiconductor device of the sixth embodiment, the voltage is approximately 11.0 V when the current density is $1\times10^{-7}$ A/μm. From the results, it is seen that the current less easily flows in the semiconductor device of the tenth embodiment than in the semiconductor device of the sixth embodiment particularly when the amount of current flowing through the semiconductor device is large and that the amount of the flowing current can be adjusted.

Eleventh Embodiment

Figure 27:
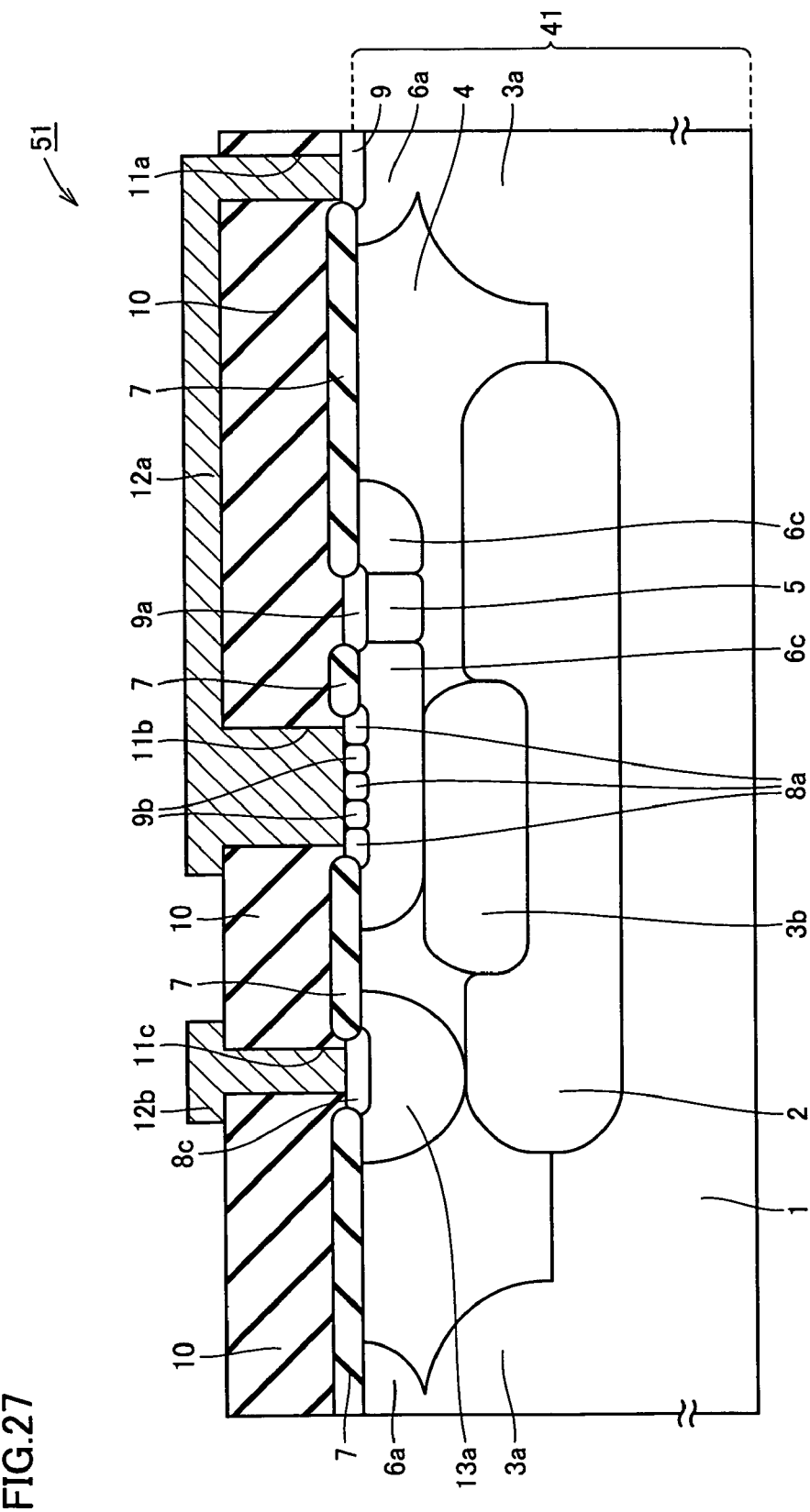
FIG. 27 is a cross-sectional view schematically showing a configuration of a semiconductor device having a surge protection circuit in an eleventh embodiment of the present invention.

Referring to FIG. 27, according to this embodiment, an n⁺ diffusion layer 13a is formed in n⁻ epitaxial layer 4 to enclose n⁺ diffusion layer 8c. N⁺ diffusion layer 13a is formed by implantation and diffusion of, for example, phosphorus glass into n⁻ epitaxial layer 4 so as to reach n⁺ diffusion layer 2. The collector region of npn transistor 23 is thus constituted of n⁺ diffusion layer 8c, n⁺ diffusion layer 13a, n⁺ diffusion layer 2 and n⁻ epitaxial layer 4. N⁺ diffusion layer 13a has its impurity concentration higher than that of n⁻ epitaxial layer 4.

It is noted that the configuration here is almost similar to that of the tenth embodiment shown in FIGS. 22 and 23 except for the above-described details. The same components are thus denoted by the same reference character and description thereof is not repeated here.

In semiconductor device 51 having the surge protection circuit of this embodiment, $n^+$ diffusion layer 13a is added to the components of the collector region of npn transistor 23. As the $n^+$ diffusion layer has a higher impurity concentration than that of the $n^-$ epitaxial layer, the electrical resistance of the collector region (collector resistance) is low. The transistor can accordingly have an improved operating speed and the surge protection circuit can operate even when a surge of high frequency occurs.

The first to eleventh embodiments have been described in connection with the semiconductor device having the circuit in FIG. 1. The present invention, however, is not limited to this semiconductor device and applicable to any semiconductor device having a surge protection circuit connected electrically to a signal input terminal and having a diode and a transistor. As for the method of forming the impurity diffusion regions, the conditions are not limited to those of the embodiments and other conditions may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a surge protection circuit electrically connected to a signal input terminal and having a diode and a transistor, comprising:
    a semiconductor substrate having a main surface;
    a field oxide film formed at the main surface of said semiconductor substrate; and
    a first conductive layer formed on the main surface of said semiconductor substrate and electrically connected to said signal input terminal,
    said diode having its cathode including a first cathode region and a second cathode region, said first cathode region being electrically connected to said first conductive layer and formed at the main surface of said semiconductor substrate, said second cathode region constituting, together with an anode region of said diode, a pn junction where Zener breakdown occurs, and said first and second cathode regions being non-contacting, and
    said pn junction where the Zener breakdown occurs being distant from said field oxide film.

2. The semiconductor device according to claim 1, wherein
    said cathode and a collector of said transistor are electrically connected to said signal input terminal, and said anode and a base of said transistor are formed to be of the same conductivity type and electrically connected to each other.

3. The semiconductor device according to claim 1, wherein
    said second cathode region is formed to cover a side or upper surface of said anode region.

4. The semiconductor device according to claim 1, wherein
    said anode region is formed to cover a side or upper surface of said second cathode region.

5. The semiconductor device according to claim 1, wherein
    said anode region and said second cathode region constituting the pn junction where Zener breakdown occurs are both formed within an epitaxial layer formed in said semiconductor substrate.

6. The semiconductor device according to claim 1, wherein
    said transistor has a collector including an epitaxial layer formed in said semiconductor substrate and a diffusion layer formed in said epitaxial layer, and said diffusion layer has its impurity concentration higher than that of said epitaxial layer.

7. The semiconductor device according to claim 1, wherein
    said transistor has a collector including an epitaxial layer formed in said semiconductor substrate and a first buried layer formed in said epitaxial layer,
    said transistor has a base including a second buried layer formed in said epitaxial layer, and
    said first buried layer has its impurity concentration higher than that of said epitaxial layer and is adjacent to said second buried layer.

8. The semiconductor device according to claim 7, wherein
    a part of said second buried layer that is adjacent to said first buried layer is a low-concentration region having a relatively low impurity concentration.

9. The semiconductor device according to claim 8, further comprising a second conductive layer formed on the main surface of said semiconductor substrate, wherein
    the base and an emitter of said transistor are both electrically connected to said second conductive layer.

* * * * *